United States Patent
Kasai et al.

(10) Patent No.: US 9,287,962 B2
(45) Date of Patent: Mar. 15, 2016

(54) SIGNAL REPRODUCTION APPARATUS AND SIGNAL REPRODUCTION METHOD

(71) Applicant: NATIONAL UNIVERSITY CORPORATION HOKKAIDO UNIVERSITY, Sapporo-shi (JP)

(72) Inventors: Seiya Kasai, Sapporo (JP); Yukihiro Tadokoro, Nagakute (JP); Akihisa Ichiki, Nagakute (JP)

(73) Assignee: NATIONAL UNIVERSITY CORPORATION HOKKAIDO UNIVERSITY, Sapporo-Shi, Hokkaido (JP)

( * ) Notice: Subject to any disclaimer, the term of this patent is extended or adjusted under 35 U.S.C. 154(b) by 0 days.

(21) Appl. No.: 14/367,689

(22) PCT Filed: Dec. 17, 2012

(86) PCT No.: PCT/JP2012/008042
§ 371 (c)(1),
(2) Date: Jun. 20, 2014

(87) PCT Pub. No.: WO2013/094172
PCT Pub. Date: Jun. 27, 2013

(65) Prior Publication Data
US 2015/0207557 A1 Jul. 23, 2015

(30) Foreign Application Priority Data
Dec. 23, 2011 (JP) ................. 2011-282505

(51) Int. Cl.
H04B 7/10 (2006.01)
H04B 7/08 (2006.01)
(Continued)

(52) U.S. Cl.
CPC .............. H04B 7/0885 (2013.01); H03F 1/26 (2013.01); H03F 3/195 (2013.01); H03F 3/211 (2013.01);
(Continued)

(58) Field of Classification Search
CPC ....... H04B 7/10; H04B 7/0894; H04B 7/0885
USPC .......................................................... 375/347
See application file for complete search history.

(56) References Cited

U.S. PATENT DOCUMENTS 5,793,704 A * 8/1998 Freger ............................. 367/95
6,959,154 B1 * 10/2005 Gnauck et al. ................ 398/159
(Continued)

FOREIGN PATENT DOCUMENTS

JP 06-069760 A 3/1994
JP 2002-221546 A 8/2002
(Continued)

OTHER PUBLICATIONS

International Search Report dated Mar. 5, 2013 in International Patent Application Publication No. PCT/JP2012/008042.
(Continued)

Primary Examiner — Kevin Kim
(74) Attorney, Agent, or Firm — McGinn IP Law Group, PLLC.

(57) ABSTRACT

A signal reproduction apparatus reproduces, from an input signal containing a weak signal which is a piece of transmission information and noise superimposed thereon, the weak signal through use of a stochastic resonance phenomenon. The apparatus includes N nonlinear elements $NL_1$-$NL_N$ (N is a natural number equal to or greater than 2) which receive N reception signals R (split signals) split to N branch lines $L_1$-$L_N$, and output nonlinear output signals $NLO_1$-$NLO_N$; N delay elements $D_1$-$D_N$ which delay the nonlinear output signals by different times, respectively; and a combiner which combines delay signals $DS_1$-$DS_N$ output from the delay elements $D_1$-$D_N$. The correlation among the noise components contained in the delay signals $DS_1$-$DS_N$ obtained by delaying the nonlinear output signal is extremely small, and the correlation of the weak signal is large.

18 Claims, 14 Drawing Sheets

(51) Int. Cl.
- *H03F 1/26* (2006.01)
- *H03F 3/21* (2006.01)
- *H03F 3/195* (2006.01)
- *H04L 25/03* (2006.01)
- *H04L 25/08* (2006.01)

(52) U.S. Cl.
CPC .......... *H04L 25/03828* (2013.01); *H04L 25/08* (2013.01); *H03F 2200/261* (2013.01); *H03F 2200/294* (2013.01)

(56) References Cited

U.S. PATENT DOCUMENTS

| | | |
|---|---|---|
| 8,314,646 B2 | 11/2012 | Kasai |
| 2006/0155551 A1 | 7/2006 | Ueda |
| 2009/0201214 A1* | 8/2009 | Falk .............................. 343/853 |
| 2011/0050332 A1 | 3/2011 | Kasai |

FOREIGN PATENT DOCUMENTS

| | | |
|---|---|---|
| JP | 2004-193803 A | 7/2004 |
| JP | 2004-312606 A | 11/2004 |
| JP | 2009-212551 A | 9/2009 |
| JP | 2011-052991 A | 3/2011 |
| JP | 2011-099820 A | 5/2011 |
| WO | WO 2004/077669 A1 | 9/2004 |
| WO | WO 2009/107263 A1 | 9/2009 |

OTHER PUBLICATIONS

J.J. Collins, Carson C. Chow and Thomas T. Imhoff, Letters to Nature. Stochastic resonance without tuning. vol.376, pp. 236-238, Jul. 20, 1995.
Extended European Search Report dated Oct. 22, 2015.
Kasai S: "Stochastic resonance in nanodevice parallel systems", Intelligent Signal Processing and Communication Systems, 2009. ISPACS 2009. International Symposium on, IEEE, Piscataway, NJ, USA, Jan. 7, 2009, pp. 363-366, XP031612818, ISBN: 978-1-4244-5015-2.

* cited by examiner $$\tau_{noise} \leq \Delta t = \Delta t_2 - \Delta t_1$$

SIGNAL REPRODUCTION APPARATUS AND SIGNAL REPRODUCTION METHOD

TECHNICAL FIELD

The present invention relates to a signal reproduction apparatus and a signal reproduction method which reproduce a weak signal from an input signal including the weak signal and noise superimposed thereof by utilizing a stochastic resonance phenomenon.

BACKGROUND ART

In the below-listed Non-patent Document 1, a known method of reproducing a weak signal is disclosed. In this known method, the weak signal is split into N signals, independent noises are added to these signals, the resultant signals are input to nonlinear elements, and the outputs of the N nonlinear elements are combined, whereby the weak signal is reproduced. This method reproduces a weak signal through unitization of a phenomenon that, when a weak signal buried in noise is input to a threshold response element having a threshold characteristic, the probability of the weak signal exceeding a threshold increases during a period during which the weak signal is present. The phenomenon that the output of the threshold response element has a higher probability of exceeding the threshold during the period during which the weak signal is present is called "stochastic resonance."

In the case where a single nonlinear element is used, for reproduction of a weak signal, it is important that the probability of the input signal exceeding a threshold increases during the period during which the weak signal is present and decreases during the period during which the weak signal is absent. Therefore, the detection accuracy of the signal increases when the relation among the threshold, the level of the weak signal, and the noise level is proper. Also, there exists an optimal noise level at which the detection accuracy is maximized.

The method of Non-patent Document 1 increases the detection accuracy of the weak signal irrespective of noise level by combining the outputs of a large number of nonlinear elements. Namely, when the noise level increases, the output of each threshold response element has a high probability of exceeding a threshold during both the period during which the weak signal is present and the period during which the weak signal is absent. In the case where the input signal exceeds the threshold due to the noise level, since the N noises to be superimposed are independent of one another, the phases at which the input signal exceeds the threshold in the N threshold response elements become random. Meanwhile, in the case where the input signal exceeds the threshold due to the presence of the weak signal, since the weak signals contained the N input signals are in phase, the outputs of the threshold response elements are also in phase. As a result, when the outputs of the N threshold response elements are combined into a single signal, the output level increases during the period during which the weak signal is present and decreases during the period during which the weak signal is absent. On the basis of such a principle, the method of Non-patent Document 1 improves the reproduction accuracy of a weak signal irrespective of noise level.

As disclosed in Patent Document 1, there has been known an apparatus which realizes the method which is disclosed in Non-patent Document 1 and in which N input signals obtained by superimposing independent noises on a weak signal are input to nonlinear elements and the outputs of the nonlinear elements are combined into a single signal. In the known apparatus, field effect transistors are used as nonlinear elements and are operated in a sub-threshold region.

Patent Document 2 discloses a circuit which improves the S/N ratio by utilizing a stochastic resonance phenomenon using a single nonlinear element and also discloses the relation between the nonlinear characteristic of the nonlinear element and the S/N ratio.

PRIOR ART DOCUMENTS

Patent Documents

Patent Document 1: Japanese Patent Application Laid-Open (kokai) No. 2009-212551
Patent Document 2: Japanese Patent Application Laid-Open (kokai) No. 2011-52991

Non-Patent Documents

Non-patent Document 1: J. J. Collins, Carson C. Chow and Thomas T. Imhoff, LETTERS TO NATURE. Stochastic resonance without tuning. vol. 376, pp. 236-238, 20 July, 1995

SUMMARY OF THE INVENTION

Problems to be Solved by the Invention

In the method of Non-patent Document 1 and Patent Document 1, the greater the number of nonlinear elements, the greater the degree to which the reproducibility of a weak signal can be improved and the greater the extent to which the S/N ratio of the combined signal can be increased even when the noise level increases. However, the method requires that noises to be applied to signals input to the N nonlinear elements should be independent of one another. If the same noise from a common noise source is applied to the signals, it becomes difficult to remove the noise component from a signal obtained by combining the output signals of the nonlinear elements. Therefore, the reproducibility of the weak signal deteriorates, and the S/N ratio of the output signal does not increase.

Accordingly, in the method of Non-patent Document 1 and Patent Document 1, it is necessary to prepare N noise sources independent of one another. Therefore, this method has a problem in that an apparatus which performs the method becomes complex.

Also, in the method of Non-patent Document 1 and Patent Document 1, it is necessary to split an input signal into N signals and apply independent noises thereto. Therefore, the method is not suitable for the case where a signal contains noise from the beginning and a weak signal buried in noise is detected; for example, the case where a signal on which noise is superimposed during transmission through a transmission path is detected or the case where mixing of noise occurs at an amplifier of a receiver.

In view of the foregoing, an object of the present invention is to accurately reproduce a weak signal contained in an input signal without requiring N independent noise sources and without application of noises generated by the noise sources to N input signals.

Means For Solving The Problems

A first invention is a signal reproduction apparatus which reproduces, from an input signal containing a weak signal which is a piece of transmission information and noise superimposed thereon, the weak signal through use of a stochastic resonance phenomenon, the apparatus being characterized by comprising a nonlinear element, and an interpolation device which performs interpolation of an output signal of the nonlinear element for the input signal, the output signal changing with time serving as a variable.

The interpolation may be performed on a signal output directly from the nonlinear element. Alternatively, the input signal input to the nonlinear element may be processed, and the processed signal is input to the nonlinear element, whereby the output signal of the nonlinear element is interpolated.

For example, in the case where the nonlinear element is a binarization element which binarizes a signal level by using a certain threshold, when an input signal containing a weak signal (transmission information) and noise superimposed thereon is input to the nonlinear element, due to level variation of noise, the output of the nonlinear element becomes a train of pluses each having a width corresponding to the frequency of the noise. The pulse duty factor (time integration of level per a certain time section; i.e., area density) of the pluses is proportional to the level of the weak signal. The interpolation means processing of increasing (amplifying) the pulse duty factor. In the pulse train which is the output of the nonlinear element and changes with time (variable), a period in which no pulse is present is filled in accordance with the presence of a pulse (the pulse duty factor) (i.e., the pulse duty factor is increased or amplified). In the present specification, the term "interpolation" is used to mean such processing of interpolating the signal level in the time axis direction.

Even in the case where the nonlinear element is not a binalization element, due to variation of the noise level, the output signal of the nonlinear element increases in the time integration of level per unit time section (i.e., the level duty factor) increases in proportion to the level of the weak signal. Accordingly, even when the nonlinear element is not a binalization element, the interpolation is defined as processing of increasing (amplifying) the level duty factor of a region where the level is relatively low in proportion to the level duty factor of the output signal of the nonlinear element. As will be described later, such interpolation can increase the duty factor of a region where the duty factor is small in accordance with the level of the weak signal by delaying the output signal of the nonlinear element by a plurality of different delay times, and combining the produced delay signals.

Desirably, the interval of the interpolation is longer than the correlation time of the noise. Also, it is desirable that the interval of the interpolation be equal to or less than the reciprocal 1/(2 f) of the double of the maximum frequency f of the weak signal to be reproduced.

In the interpolation, the output signal of the nonlinear element is passed through a low pass filter or an integrator so as to cut off frequency components whose frequencies are equal to or higher than a certain frequency, whereby the pulses of the output signal of the nonlinear element are broadened, or the change of the signal is smoothed. Thus, the duty factor of a region where the duty factor is small can be increased in accordance with the level of the weak signal. Notably, arbitrary interpolation can be used. For example, interpolation may be performed by delaying and combining or through use of a low pass filter or an integrator. Alternatively, interpolation may be performed by cumulating pulse areas and differentiating the resultant value with respect to time. Since the integrator is one type of the low pass filter, the term "low pass filter" encompasses integrators.

In the above-described invention, the nonlinear element is an element of binary output such as a threshold response element which outputs a signal in response to a signal exceeding a threshold, or an element having a nonlinear characteristic such that the increase rate of the output level to an increase in the input level is small when the input level is low, and increases when the input level is high. A comparator or a transistor may be used as the threshold response element. A bipolar transistor which operates in a nonlinear region or a unipolar transistor such as a field effect transistor may be used as the nonlinear element.

The input signal may be an analog signal or a digital signal obtained by sampling an analog signal and performing A/D conversion. In the case where the input signal is a digital signal, a functional computing element may be used as the nonlinear element. A nonlinear function realized by the functional computing element may be a logistic function, a sigmoid function, or a step function. An arbitrary element can be used as a nonlinear element which handles analog signals so long as the element has a nonlinear input-output relation.

The weak signal which is a piece of transmission may be a periodic signal, an aperiodic signal, or a single signal which is present for a certain time. The weak signal may be a wave having an arbitrary waveform such as a sinusoidal wave or a rectangular wave. Alternatively, the weak signal may be a signal obtained by modulating a sinusoidal wave by an arbitrary signal.

In the case where the nonlinear characteristic of the nonlinear element is such that a threshold is set (e.g., a step function), the threshold may be a reference level, or a threshold is set in each of two regions on the positive and negative sides of a reference level. Also, the input-output relation may involve hysteresis as in the case of a Schmidt trigger. In the case where a comparator is used for the nonlinear element, the comparator may be a window comparator which outputs a reference level when the level of an input signal is between a first threshold and a second threshold greater than the first threshold, outputs an L level lower than the reference level when the level of the input signal is lower than the first threshold, and outputs an H level higher than the reference level when the level of the input signal is higher than the second threshold.

In general, the voltage level of a weak signal to be detected is smaller than the power level of noise. However, the voltage level of the weak signal may be larger than the power level of noise. In the case where the nonlinear characteristic of each nonlinear element has a threshold, the threshold may be set to an arbitrary value equal to or smaller than the voltage level of the input signal containing the weak signal and noise superimposed thereon. The threshold may be set to the reference level of the input signal. In the case where the threshold is set to the reference level of the input signal, if the weak signal is a signal which vibrates toward the positive and negative sides with respect to a reference level (the center of vibration), the waveform of the weak signal can be reproduced over the entire cycle. For example, in the case where the reference level of the input signal is 0, the threshold may be 0. In the following description, it is assumed that each of the weak signal, the noise, and the input signal containing noise superimposed thereon is a signal which vibrates toward the positive and negative voltage sides when the reference level (bias level) is considered as a zero level. In the case where the threshold is set to 0, the waveform of the weak signal can be reproduced over the entire cycle in which the weak signal becomes positive and negative. The input signal containing a weak signal and noise superimposed thereon is a signal in which the voltage level of the noise changes with the voltage level of the weak signal. Therefore, when a threshold is set in the positive region, the waveform of the weak signal in the positive period can be reproduced more accurately than the waveform in the negative period. In contrast, when a threshold is set in the negative region, the waveform of the weak signal in the negative period can be reproduced more accurately than the waveform in the positive period.

A second invention is a signal reproduction apparatus according to the first invention wherein the interpolation device includes N branch lines (N is a natural number equal to or greater than 2), N delay elements which delay N split signals supplied to the branch lines by different times, respectively, and a combiner which combines into a single signal the signals which have passed at least the corresponding delay elements in the N branch lines.

In general, the maximum frequency of the weak signal is lower than the maximum power frequency of noise. When N input signals are delayed by different delay times, respectively, and nonlinear output signals of the delay signals are generated and combined, the noise component does not have correlation with the delay, and the weak signal has correlation with the delay. Therefore, in the combined signal, the noise component is canceled, and the weak signal is amplified by autocorrelation. Even in the case where nonlinear output signals of N input signals are generated, and the nonlinear output signals are delayed by different delay times, respectively, and are combined, the noise component does not have correlation with the delay, and the weak signal has correlation with the delay. Therefore, in the combined signal, the noise component is canceled, and the weak signal is amplified by autocorrelation. By this principle, the present invention improves the S/N ratio of the combined signal.

In the present invention, the number N of the branch lines and the number N of the delay elements are arbitrary so long as N is a natural number equal to or greater than 2. It is desirable that N be equal to or greater than 10, and is more desirable that N be equal to or greater than 100. In the case where N is equal to or greater than 100, deterioration of the reproduction accuracy of the weak signal caused by an increase in the noise level can be suppressed. In the case where N is equal to or greater than 1000, the weak signal is reproduced with a constant accuracy which is attained with a high degree of certainty irrespective of an increase in the noise level.

The positional relation between the nonlinear element and the delay element disposed in each branch line may be such that the output signals of the nonlinear elements are input to the delay elements and the outputs of the delay elements are combined, or such that the output signals of the delay elements are input to the nonlinear elements and the outputs of the nonlinear elements are combined. In either case, there can be obtained a signal in which the outputs of the nonlinear elements are delayed and combined.

Accordingly, in the above-described invention, the interpolation device may be configured such that the input signal is split into split signal to be supplied to the N branch lines, the nonlinear element is provided in each of the N branch lines, the split signals from the input signals are input to the nonlinear elements, output signals of the nonlinear elements are input to the delay elements, and the combiner combines output signals of the delay elements.

Also, in the above-described invention, the interpolation device may be configured such that the input signal is split into split signals to be supplied to the N branch lines, the split signals split from the input signal are input to the delay elements, the nonlinear element is provided in each of the N branch lines, output signals of the delay elements are input to the nonlinear elements, and the combiner combines output signals of the nonlinear elements.

Also, in the above-described invention, if the nonlinear elements provided in the branch lines have the same characteristic, a single nonlinear element may be provided in a stage before the input signal is distributed to each distribution circuit.

Namely, in the above-described invention, the interpolation device may be configured such that the input signal is input to the nonlinear element, an output signal of the nonlinear element is split into N split signals to be supplied to the N branch lines, the split signals are input to the delay elements, and the combiner combines output signals of the delay elements.

Also, there are two orders in which the nonlinear element and the delay element are connected; i.e., the nonlinear element and the delay element are connected in this order from the side where a signal is input, or the delay element and the nonlinear element are connected in this order from the side where a signal is input.

Accordingly, in the above-described invention, the interpolation device may be configured such that a first line in which the nonlinear element and the delay element are connected in this order from a side where the input signal is input and a second line in which the delay element and the nonlinear element are connected in this order from a side where the input signal is input are present in a mixed manner, and the combiner combines the output signals of elements which are the nonlinear elements or the delay elements and which are located on the rear stage.

In the present invention, the number of the delay elements is N and the number of the branch lines including the delay elements is N; however, the number of the nonlinear elements is not greater than N but not less than 2. In the case where the number of the nonlinear elements is N, there exist N series circuits each including a delay element and a nonlinear element. The nonlinear elements of the branch lines in which the nonlinear elements are provided in a stage before the delay elements can be replaced with a single common nonlinear element. In this case, the number of the nonlinear elements is not less than 2 but less than N.

Accordingly, in the above-described invention, the interpolation device may be configured such that a single nonlinear element is provided in the first line, and an output signal of the nonlinear element is split into a plurality of split signals which are input to the delay elements in the first line.

If the characteristics of the nonlinear elements provided in the distribution circuits are non-uniform, different transmission delay times can be given by the characteristics.

Accordingly, in the above-described invention, the interpolation device may be configured such that the nonlinear elements produce different delays in output due to non-uniformity of their characteristics, and serve as the corresponding delay elements.

Also, in the above-described invention, the delay times of the delay elements are arbitrary so long as they differ from one another. However, they may have regularity. For example, the delay times may be given by an arithmetic progression with a common difference $\Delta t$. When the delay times are given by an arithmetic progression, the reproducibility of the minute signal can be improved further.

Also, it is desirable that the minimum delay time difference which is the smallest one of differences among the delay times of the N delay elements be greater than the correlation time of the noise superimposed on the input signal. In the case where a plurality of input signals or the nonlinear output signals of the input signals are delayed and combined so as to cancel noise components, it is necessary that correlation with the delayed noises is not present. Accordingly, in the case of white noise, the correlation time is short. However, it is desirable that the minimum value of the delay time difference be made larger than the time within which the correlation becomes a certain value or lower. At this time, in the combined signal, the noise components can be cancelled effectively, and the weak signal which is a piece of transmission information can be reproduced.

Also, it is desirable that the maximum delay time difference which is the largest one of differences among the delay times of the N delay elements be equal to or less than $1/(2\,f)$, where f is the maximum frequency of the weak signal to be reproduced. The maximum frequency to be reproduced is a maximum frequency required for reproduction of the weak signal for an intended purpose, and is equal to or lower than the frequency of the maximum frequency component which constitutes the weak signal. It is determined by the required degree of reproduction of the waveform of the weak signal. $1/(2\,f)$ is the half of the cycle corresponding to the maximum frequency. When sine waves or cosine waves of the maximum frequency are delayed by delay times within the half cycle and are combined, their waveform is maintained, the waveform of the weak signal can be reproduced. Also, the maximum delay time difference may be equal to or less than $1/(4\,f)$; i.e., equal to or less than the quarter of the cycle.

Also, it is desirable that the maximum delay time difference which is the largest one of differences among the delay times of the N delay elements be equal to or less than T, where T is a time width which is a reproduction unit of the weak signal. This time width corresponds to $1/(2\,f)$ where f is the maximum frequency of the above-described weak signal to be reproduced. In the case where a signal which changes with the time width T is reproduced, the maximum delay time difference must be equal to or less than T. Also, when the the maximum delay time difference is set to T/2, the autocorrelation of the minute signal increases further, whereby the reproduction accuracy increases further.

A third invention is a signal reproduction apparatus according to the first invention, wherein the input signal is input to the nonlinear element, and the interpolation device is a low pass filter to which an output signal of the nonlinear element is input.

An analog filter may be used as the low pass filter in the case where the input signal is analog. A digital filter may be used in the case where the input signal is a digital signal or the case where the input signal is analog and is converted to a digital signal after being sampled.

In the case where a digital filter is used, the number of the taps is arbitrary. The number N of the taps is arbitrary so long as it is a natural number equal to or greater than 2. It is desirable that N be equal to or greater than 10, and is more desirable that N be equal to or greater than 100. In the case where N is equal to or greater than 100, deterioration of the reproduction accuracy of the weak signal caused by an increase in the noise level can be suppressed. In the case where N is equal to or greater than 1000, the weak signal is reproduced with a constant accuracy which is attained with high degree of certainty irrespective of an increase in the noise level. The tap coefficients may be set such that the transfer function of a predetermined low pass filter is obtained. Notably, when all the tap coefficients are set to 1, the digital filter functions as a low pass filter whose frequency characteristic becomes a sigmoid function. Therefore, the weak signal can be reproduced.

Also, in the case where a digital filter is used, it is desirable that the sampling period $\Delta t$ of the input signal be longer than the correlation time of the noise superimposed on the input signal. Here, the reciprocal of the correlation time is defined as a correlation frequency. In the noise, frequency components whose frequencies are equal to or lower than the correlation frequency are sufficiently smaller than frequency components whose frequencies are equal to or higher than the correlation frequency. Accordingly, the noise component in the first Brillouin zone (band equal to or lower than $1/\Delta t$) of the Fourier transformation of the input signal sampled at the sampling period $\Delta t$ becomes sufficiently small. In other words, the digital filter is equivalent to an operation of delaying the nonlinear output signal of the input signal by $\Delta t$ at each tap and combining the resultant delay signals. Accordingly, in order to cancel the noise component through combining, it is necessary that there is no correlation with the delayed noises. Accordingly, it is desirable that the sampling period $\Delta t$ be longer than a time within which the correlation of noise becomes a certain value or smaller. At this time, in the combined signal, the noise component can be cancelled effectively, and the weak signal which is a piece of transmission information can be reproduced. Also, it is desirable that the time T of a window (namely, the number N of taps×the sampling period $\Delta t$) be equal to or shorter than a time corresponding to $1/(2\,f)$ where f is the maximum frequency of the above-described weak signal to be reproduced. Since $N\Delta t$ provides the cutoff frequency of the low pass filter, it is equivalent to setting the cutoff frequency to a frequency equal to or higher than the double ($2\,f$) of the maximum reproduction frequency f of the weak signal.

Also, in the case where the Fourier transformation of the input signal is compared with the Fourier transformation of the nonlinear output signal output from the nonlinear element into which the input signal is input, because of stochastic resonance due to the nonlinearity, the weak signal component becomes large relative to the noise in the latter case. Therefore, the weak signal can be extracted effectively by inputting the nonlinear output signal to the low pass filter. Accordingly, it is desirable that the cutoff frequency of the low pass filter be set to a frequency equal to or higher than the upper limit (upper limit frequency) of a frequency range within which the level of the spectral of the output signal of the nonlinear element obtained through Fourier transformation becomes higher than the level of the noise. However, it is most desirable that the cutoff frequency of the low pass filter be set to the upper limit frequency. In this case, only the frequency components of the input signal within the frequency range where the level of the input signal becomes higher than the noise level are extracted, whereby the component of the weak signal is extracted more. As a result, the weak signal can be detected accurately.

Also, it is desirable that the cutoff frequency of the low pass filter is set to fall within a range between ½ of the upper limit frequency and the double of the upper limit frequency. When the cutoff frequency falls within this range, the component of the input signal can be extracted accurately. Also, the following view can be applied to the cutoff frequency of the low pass filter. In order to reproduce signals up to the maximum frequency f of the weak signal to be reproduced, the cutoff frequency must be set to a frequency equal to or higher than $2\,f$. Meanwhile, the cutoff frequency must be set to a frequency lower than the correlation frequency (1/the correlation time) of the noise. Accordingly, it is desirable that the cutoff frequency be set to a frequency not lower than $2\,f$ but not higher than the correlation frequency of the noise.

Also, it is most desirable that the cutoff frequency of the low pass filter be set to $2\,f$ where f is the maximum frequency of the weak signal to be reproduced. When the cutoff frequency is set to $2\,f$, the impulse response of this low pass filter becomes a sigmoid function in which the first zero point becomes 1/(2 f). Accordingly, on the time axis, this means that a time window of 1/f by the sigmoid function is set to a transversal filter. This makes it possible to extract the weak signal component from the nonlinear output signal. A rectangular wave function, a sigmoid function, a Butterworth function, a Chebyshev function, an elliptic function, and other transfer functions generally used in filter design may be employed as the transfer function of the low pass filter.

A fourth invention is a signal reproduction method of reproducing, from an input signal containing a weak signal which is a piece of transmission information and noise superimposed thereon, the weak signal through use of a stochastic resonance phenomenon, the method being characterized by comprising obtaining a nonlinear output signal for the input signal by using a nonlinear input output characteristic, and performing interpolation of the nonlinear output signal which changes with time serving as a variable, to thereby reproduce the weak signal.

This invention is a method invention corresponding to the first apparatus invention. Accordingly, the description which is made for the above-described apparatus invention also applies to the method invention.

A fifth invention is a signal reproduction method according to the fourth invention, wherein the interpolation is performed by generating N nonlinear output signals which are delayed by N different delay times (N is a natural number equal to or greater than 2), from the input signal and combining the N nonlinear output signals into a single signal.

This invention is a method invention corresponding to the second apparatus invention. The N delay signals of the input signal or the N delay signals of the nonlinear output signal of the input signal have correlation with the weak signal but do not have correlation with the noise. Therefore, by combining the signals delayed and subjected to nonlinear processing, the noise can be cancelled, and the weak signal can be amplified, whereby the weak signal can be reproduced effectively.

In this method invention, the order of the signal delaying operation and the nonlinear-output-signal generation operation is arbitrary and is as described above. Also, as already described for the apparatus invention, the nonlinear output signal of the input signal may be generated and split into N nonlinear output signals which are then delayed by different delay times, respectively.

Since the required is that N delayed nonlinear output signals are finally obtained, as described above, there exist, in a mixed manner, the case where the input signal is delayed and then the nonlinear output is obtained and the case where the nonlinear output of the input signal is obtained and then delayed.

In this method invention as well, it is desirable that the minimum delay time difference which is the smallest one of differences among the N different delay times be greater than the correlation time of the noise superimposed on the weak signal.

Also, it is desirable that the maximum delay time difference which is the largest one of differences among the N different delay times be set to 1/(2 f) or less, where f is the maximum frequency of the weak signal to be reproduced. It is more desirable that the maximum delay time difference be set to 1/(4 f) or less.

Also, it is desirable that the maximum delay time difference which is the largest one of differences among the N different delay times be equal to or less than T, where T is a time width which is the reproduction unit of the weak signal. Further, it is desirable that the maximum delay time difference is T/2 or less, A sixth invention is a signal reproduction method according to the fourth invention, wherein the interpolation is performed by removing, from the nonlinear output signal, high frequency components whose frequencies are equal to or higher than a cutoff frequency.

The present method invention corresponds to the method invention of the third apparatus invention, and the items described for the apparatus invention also apply to the present method invention. Also, in the present invention, it is desirable that the cutoff frequency be set to a frequency equal to or higher than the upper limit of a frequency range within which the level of the Fourier transformation of the nonlinear output signal is higher than the level of the noise. Also, it is desirable that the cutoff frequency be set to 2 f, where f is the maximum frequency of the weak signal to be reproduced. Also, it is desirable that the high frequency components whose frequencies are equal to or higher than the cutoff frequency is removed by a digital filter, and a sampling period of the input signal be longer than a correlation time of the noise.

Effects of the Invention

According to the present apparatus invention and method invention, in a signal reproduction apparatus which reproduces, from an input signal containing a weak signal which is a piece of transmission information and noise superimposed thereon, the weak signal through use of a stochastic resonance phenomenon, interpolation is performed for the output signal of a nonlinear element for the input signal, the output signal changing with time (variable). Due to level variation of the noise, the output signal of the nonlinear element changes, in terms of the time integration of the level in a certain time section (the duty factor of the signal, the area density of the signal), in proportion to the level of the weak signal. Through the interpolation in the time axis, the duty factor is increased, whereby the sensitivity of the signal to be reproduced is improved.

The second and fifth inventions are characterized in that N input signals or the nonlinear output signals of the input signals are delayed by different times and combined into a single signal. Each signal obtained through the nonlinear processing and the delaying processing (hereinafter simply referred to as a "delay signal") has correlation with the weak signal which is a piece of transmission information and does not have correlation with the noise. Therefore, by combining the delay signals (hereinafter referred to "delaying and combining operation"), the noise can be cancelled and the weak signal can be amplified, whereby the weak signal can be reproduced effectively.

At this time, the minimum delay time difference which is the smallest one of differences among the N delay times is made greater than the correlation time of the noise superimposed on the input signal. Therefore, the noise is effectively removed as a result of combining the delay signals. Also, the maximum delay time difference which is the largest one of differences among the N delay times is made equal to or less than 1/(2 f), desirably, equal to or less than 1/(4 f), where f is the maximum frequency of the weak signal to be reproduced. Since the period of 1/(2 f) or 1/(4 f) is a period in which each delay signal has a strong correlation with the weak signal, the weak signal can be amplified by the delaying and combining operation. Also, the maximum delay time difference which is the largest one of differences among the N delay times is made equal to or less than T, desirably, equal to or less than T/2, where T is a time width which becomes the reproduction unit of the weak signal. Since the time T or T/2 is a period in which each delay signal has a strong correlation with the weak signal, the weak signal can be amplified by the delaying and combining operation. As a result, the S/N ratio of the combined signal can be increased.

Also, the greater the number N of the delay signals to be combined, the greater the degree to which a decrease in the S/N ratio can be suppressed even when the noise level increases. For example, in the case where N is equal to or greater than 10, the weak signal is reproduced at a probability of 0.6 or greater irrespective of the noise level. In the case where N is equal to or greater than 100, even when the level of the mixed noise increases, the weak signal can be reproduced almost completely, whereby the S/N ratio of the signal reproduced through combining can be increased and is prevented from decreasing. In the case where N is equal to or greater than 1000, even when the noise level increases, the maximum S/N ratio can be maintained, and the weak signal can be reproduced stably irrespective of an increase in the noise level. Also, since the method of the present invention is not a method in which N individual noises are superimposed on the input signal, the source of noises to be superimposed is unnecessary, and a complicated apparatus or method in which N noise sources having no correlation are provided is not required.

In the third and sixth inventions, the input signal containing a weak signal which is a piece of transmission information and noise superimposed thereon is input to a nonlinear element whose input-output characteristic is nonlinear to thereby obtain a nonlinear output signal, and frequency components of the nonlinear output signal whose frequencies are equal to or higher than the cutoff frequency are cut off. Even in the case where the weak signal is buried in noise in the input signal, in the nonlinear output signal, the level of the weak signal becomes large as compared with the level of the noise. As a result, when the band of the weak signal is extracted from the nonlinear output signal by the low pass filter, accurate detection of the weak signal is realized.

In the case of digital processing, the sampling period AT of the input signal is made longer than the correlation time of the noise superimposed on the input signal. Thus, the noise is effectively removed as a result of combining of the delay signals. Also, the cutoff frequency is set to 2 f (f is the maximum frequency of the weak signal to be reproduced), and the frequency components whose frequencies are equal to or higher than the cutoff frequency are removed from the nonlinear output signal. Thus, extraction of the weak signal becomes possible, and the S/N ratio can be increased.

In the case of digital processing, the greater the number N of the taps of the digital filter, the greater the degree to which a decrease in the S/N ratio is suppressed even when the noise level increased. For example, in the case where N is equal to or greater than 10, the weak signal is reproduced at a probability of 0.6 or greater irrespective of the noise level. In the case where N is equal to or greater than 100, even when the level of the mixed noise increases, the weak signal can be reproduced almost completely, whereby the S/N ratio of the signal reproduced through combining can be increased and is prevented from decreasing. In the case where N is equal to or greater than 1000, even when the noise level increases, the maximum S/N ratio can be maintained, and the weak signal can be reproduced stably irrespective of an increase in the noise level. Also, since the method of the present invention is not a method in which N individual noises are superimposed on the input signal, the source of noises to be superimposed is unnecessary, and a complicated apparatus or method in which N noise sources having no correlation are provided is not required.

BRIEF DESCRIPTION OF THE DRAWINGS

FIG. 2.B is a block diagram showing the configuration of a signal reproduction apparatus according to a modification of the second embodiment of the present invention.

FIG. 3.B is a block diagram showing the configuration of a signal reproduction apparatus according to a modification of the third embodiment of the present invention.

MODES FOR CARRYING OUT THE INVENTION

Specific embodiments of the present invention will now be described; however, the present invention is not limited to the embodiments.

First Embodiment

Figure 1:
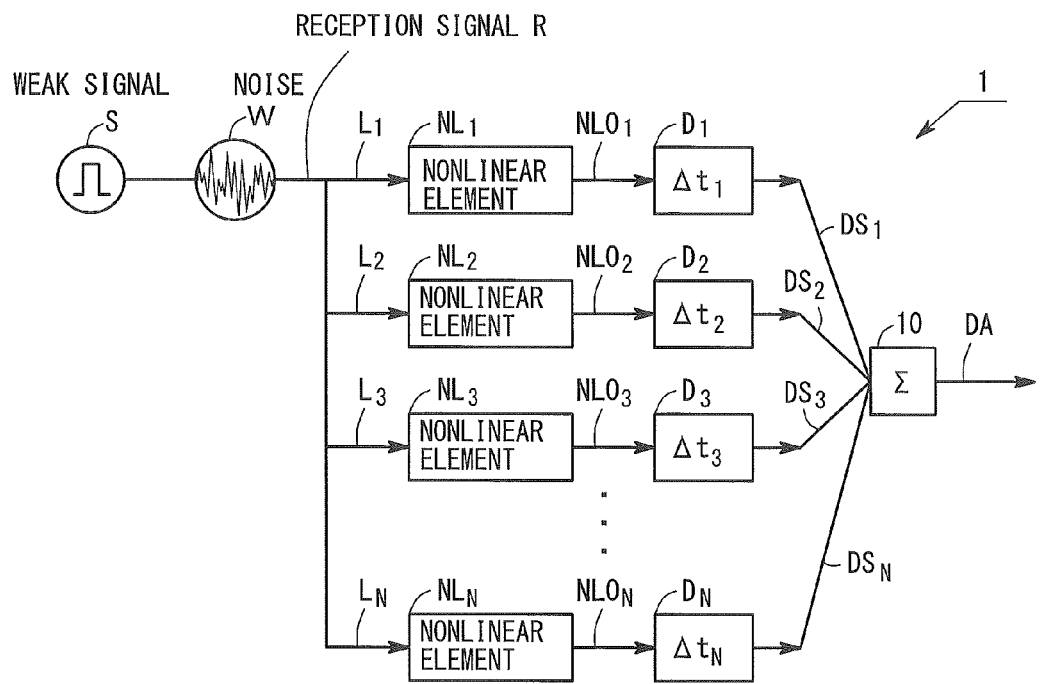
FIG. 1 is a block diagram showing the configuration of a signal reproduction apparatus according to a first embodiment of the present invention.

FIG. 1 is a block diagram showing the configuration of a signal reproduction apparatus 1 according to a specific one embodiment of the present invention. A reception signal R (input signal) containing a weak signal S (transmission information) and noise W superimposed thereon is input to the signal reproduction apparatus 1. In the present embodiment, the noise W includes not only noise which is mixed with the signal in a transmitter or on a transmission path, but also noise which is superimposed on the signal at an amplifier of a receiver provided in a stage before the signal reproduction apparatus 1. Namely, the noise W referrers to the noise contained in the input signal input to the present signal reproduction apparatus 1, and noise is not added separately in the present apparatus.

In the present embodiment, the input signal is represented by a reception signal R. The signal reproduction apparatus 1 has N branch lines $L_1$-$L_N$ for splitting the reception signal R into N signals. A series circuit of a nonlinear element $NL_1$-$NL_N$ and a delay element $D_1$-$D_N$ is provided in each branch line $L_1$-LN. The total number of nonlinear elements $NL_1$-$NL_N$ and the total number of the delay elements $D_1$-$D_N$ are N. Respective nonlinear output signals $NLO_1$-$NLO_N$ output from the nonlinear elements $NL_1$-$NL_N$ are input to the corresponding delay elements $D_1$-$D_N$. Delay signals $DS_1$-$DS_n$ output from the delay elements $D_1$-$D_N$ are combined into a single signal by a combiner 10. The output of the combiner 10 will be referred as a delayed combined signal DA.

Figure 5:
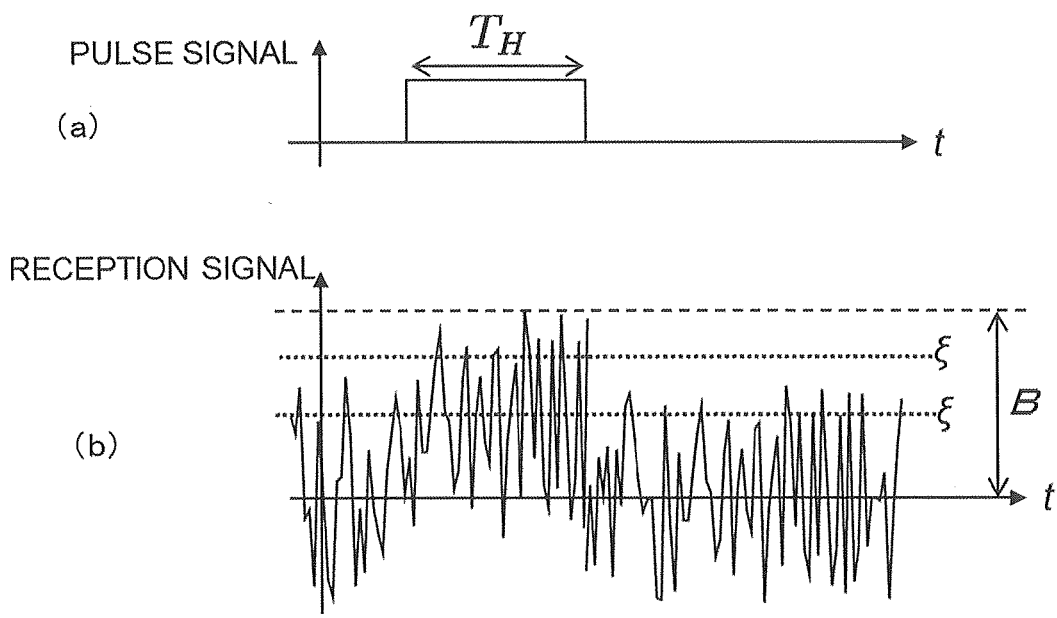
FIG. 5 is a pair of waveform diagrams showing the relation between noise and a weak signal input to the signal reproduction apparatus of the first embodiment of the present invention.
Figure 6:
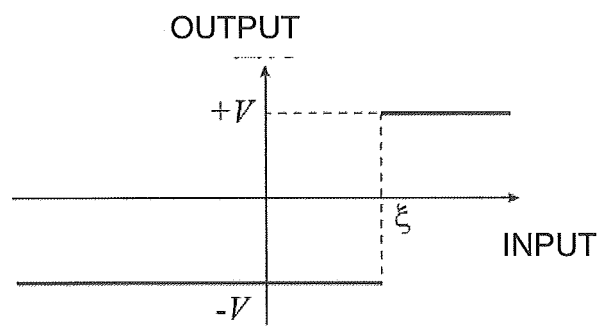
FIG. 6 is a graph showing the nonlinear characteristic of a comparator used in the signal reproduction apparatus of the first embodiment of the present invention.

In the present embodiment, each of the nonlinear elements $NL_1$-$NL_N$ is a comparator which is a threshold response element. The comparator has a nonlinear characteristic as shown in FIG. 6. When the input signal is equal to or greater than a threshold $\xi$, the comparator outputs a nonlinear output signal whose level is +V (hereinafter referred to as "H level"). When the input signal is smaller than the threshold $\xi$, the comparator outputs a nonlinear output signal whose level is -V (hereinafter referred to as "L level"). In the present embodiment, the weak signal S is a pulse signal as shown in FIG. 5($a$) which has a pulse width $T_H$. The reception signal R containing this weak signal S and white noise W superimposed thereon has a waveform as shown in FIG. 5($b$). Since the voltage level of the noise W is larger than the voltage level of the weak signal S, the weak signal S is buried in the noise W. Accordingly, the weak signal S cannot be extracted by a filter or the like.

Figure 7:
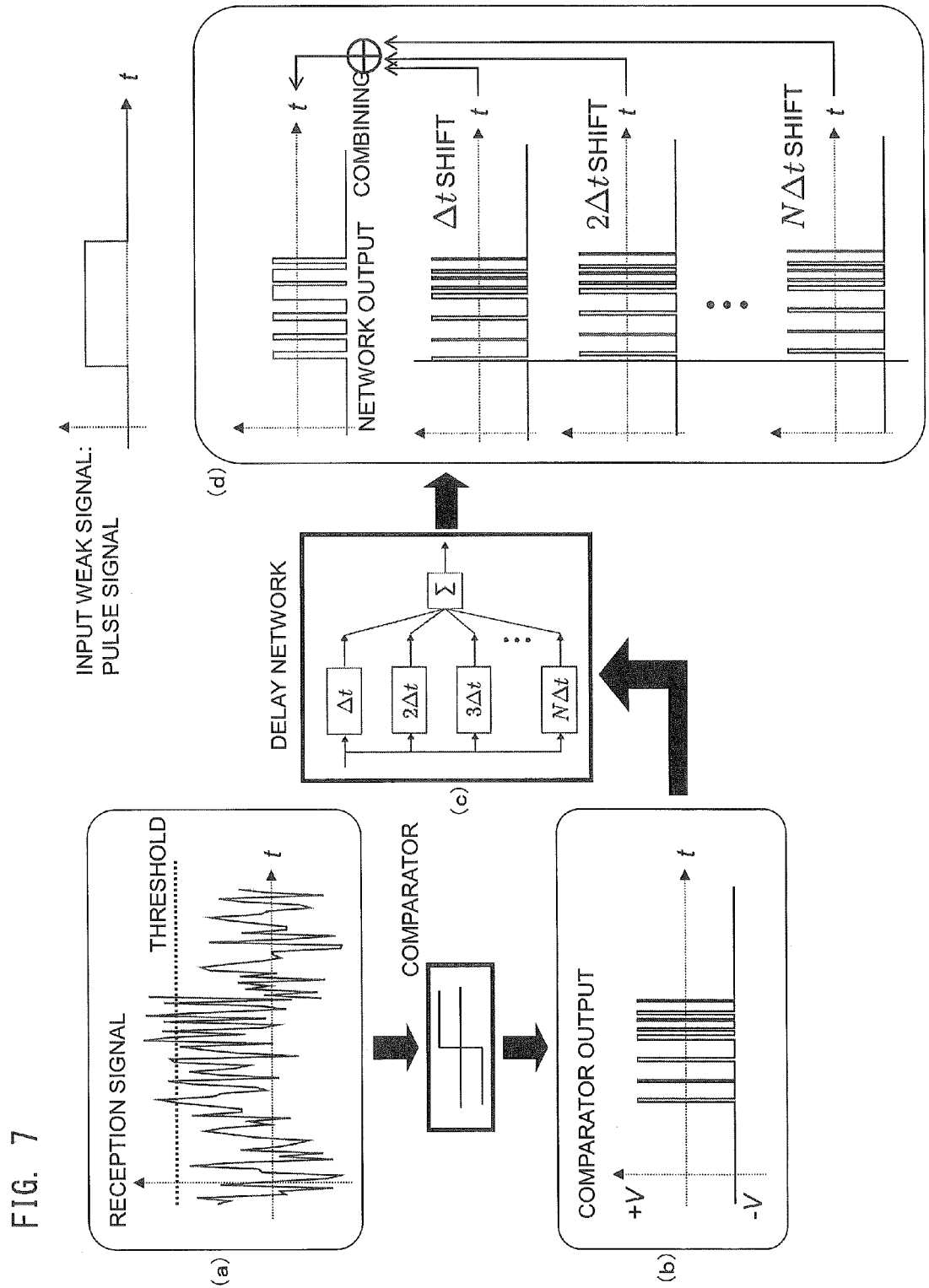
FIG. 7 is an explanatory view used for explaining operation of the signal reproduction apparatus of the first embodiment of the present invention.

When the reception signal R containing this weak signal S and white noise W superimposed thereon is input to the comparator, the comparator outputs a signal which becomes the H level during periods during which the reception signal R is equal to or greater than the threshold $\xi$, and becomes the L level during periods during which the reception signal R is smaller than the threshold $\xi$. The output signal of the comparator is shown in FIG. 7($b$). Notably, since the threshold $\xi$ is set to a high value as shown in FIG. 7($a$), during periods during which the weak signal S is absent, the output of the comparator is fixed to the L level and does not change as shown in FIG. 7($b$). However, when the threshold $\xi$ is set to a lower value, for example, to zero (0 level), even during periods during which the weak signal S is absent, the output of the comparator includes a large number of pulses each of which becomes the H level within a very short period. As shown in FIG. 5, the threshold $\xi$ can be freely set within a range B between the maximum voltage level of the reception signal R and the 0 level.

Next, the nonlinear output signal $NLO_1$-$NLO_N$ that are the output signals of the comparators are input to the corresponding delay elements $D_1$-$D_N$. A unit delay time is $\Delta t$, and the delay times of the delay elements $D_1$-$D_N$ are $\Delta t$, ... $k\Delta t$, ... $N\Delta t$ (k=1, 2, ... N). Namely, the delay times are given by an arithmetic progression with a common difference $\Delta t$. The delay signals $DS_1$-$DS_n$ output from the delay elements $D_1$-$D_N$ are shown in FIG. 7($d$). These delay signals $DS_1$-$DS_n$ are input to the combiner 10 and are combined. Since the level of the noise contained in the reception signal R is changed by the weak signal whose frequency is lower than the frequency of the noise, during the period during which the weak signal is present, the probability that the reception signal R becomes equal to or greater than the threshold $\xi$ is higher than those during other periods. Accordingly, during the period during which the weak signal S is present, the pulse signal shown in FIG. 7($d$) has a greater pulse occupation area as compared with those in other periods.

Each of the nonlinear output signals $NLO_1$-$NLO_N$ output from the comparators (the nonlinear elements $NL_1$-$NL_N$) includes a weak signal component and a noise component. However, among the delay signals $DS_1$-$DS_n$ obtained by delaying the nonlinear output signals $NLO_1$-$NLO_N$ by different times, there exists no correlation regarding the noise component, and there exists a strong correlation regarding the weak signal component. Therefore, the delayed combined signal DA (shown in FIG. 7($d$)) obtained by combining, by the combiner 10, the delay signals $DS_1$-$DS_n$ obtained by delaying the nonlinear output signals becomes one in which the noise component has been removed. Thus, there can be obtained an autocorrelation signal in which the N weak signal components are large. As described above, it is possible to amplify the weak signal S only while removing the noise. As a result, the delayed combined signal DA output from the combiner 10 has an improved S/N ratio.

Figure 8:
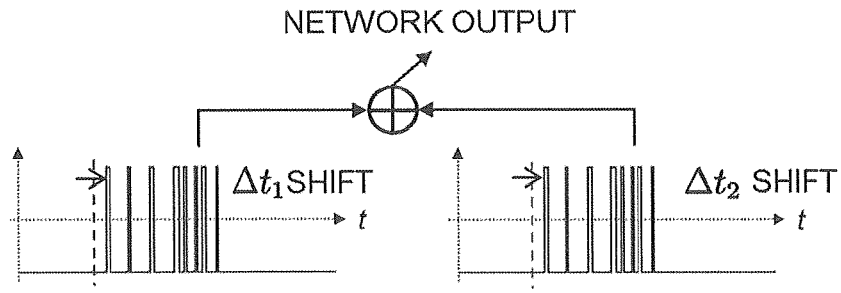
FIG. 8 is an explanatory view used for explaining operation of the signal reproduction apparatus of the first embodiment of the present invention.
Figure 12:
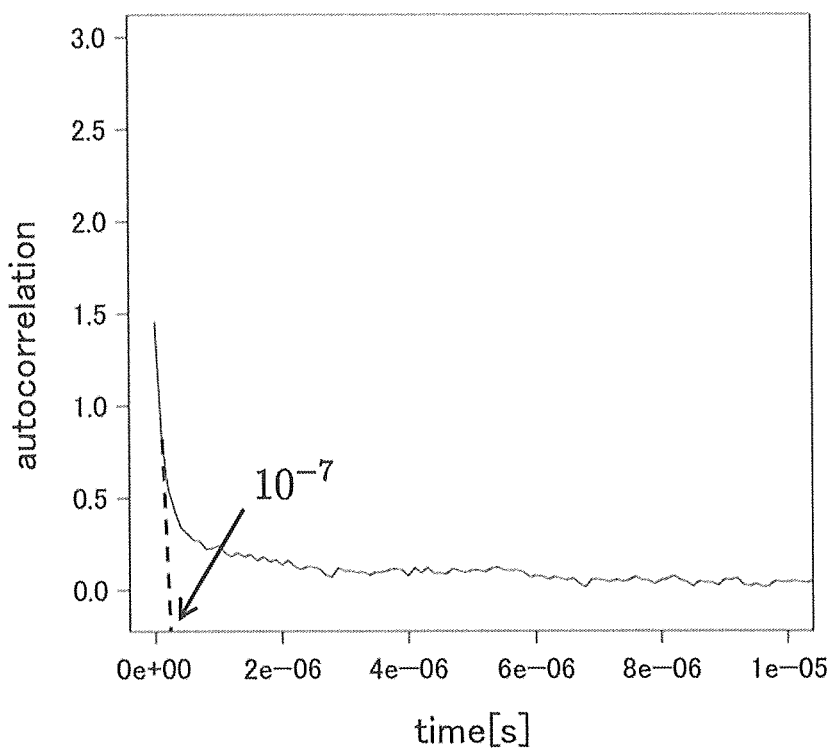
FIG. 12 is a characteristic graph showing the relation between the delay time and autocorrelation of noise.

FIG. 8 shows an operation of combining the delay signal $D_1$ obtained by delaying the nonlinear output signal $NLO_1$ by $\Delta t_1$ and the delay signal $D_2$ obtained by delaying the nonlinear output signal $NLO_2$ by $\Delta t_2$. The autocorrelation value of noise has a characteristic as shown in FIG. 12. Its autocorrelation time is about $10^{-7}$ sec. Accordingly, by means of making the minimum delay time difference (the common difference $\Delta t$ when the delay time is given by the arithmetic progression) equal to or greater than $10^{-7}$ sec, the correlation between the noise components contained in the delay signal $DS_1$-$DS_n$ obtained by delaying the nonlinear output signals can be made extremely small, and the delayed combined signal DA obtained by combining these delay signals $DS_1$-$DS_n$, has no noise component.

Figure 9:
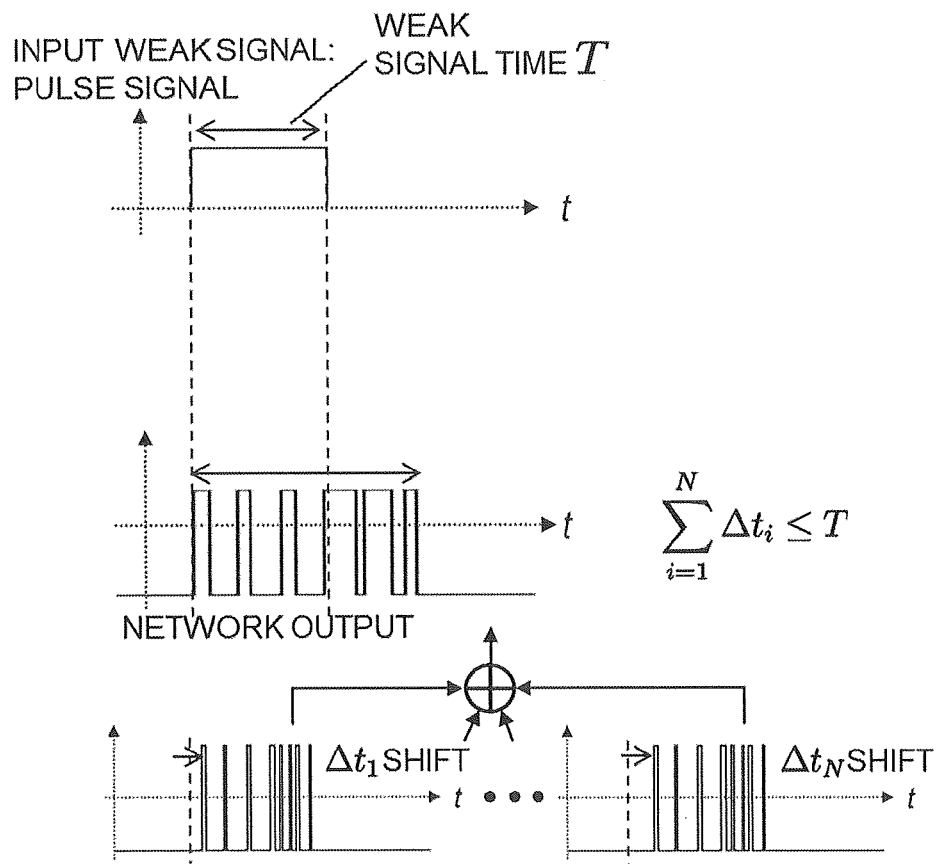
FIG. 9 is an explanatory view used for explaining operation of the signal reproduction apparatus of the first embodiment of the present invention.

Meanwhile, in the case where the weak signal is a pulse signal shown in FIG. 9 and having a pulse width T, the maximum delay time difference ((N−1)$\Delta t$=$\Delta t_N$-$\Delta t_1$) is made equal to or smaller than the pulse width T. The pulse signal is high in autocorrelation during the period of this pulse width T. Also, by setting the maximum delay time difference to T/2, the delaying and combining operation can be performed in a period during which the autocorrelation is large, whereby more accurate signal reproduction becomes possible.

Figure 14:
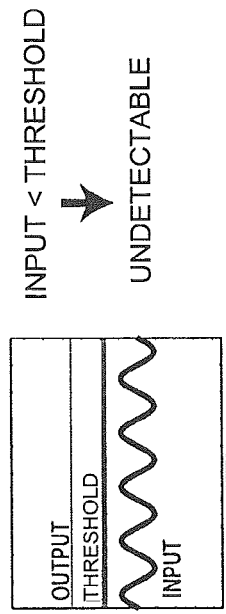
FIG. 14 is an explanatory graph with an illustration used for explaining stochastic resonance.
Figure 14:
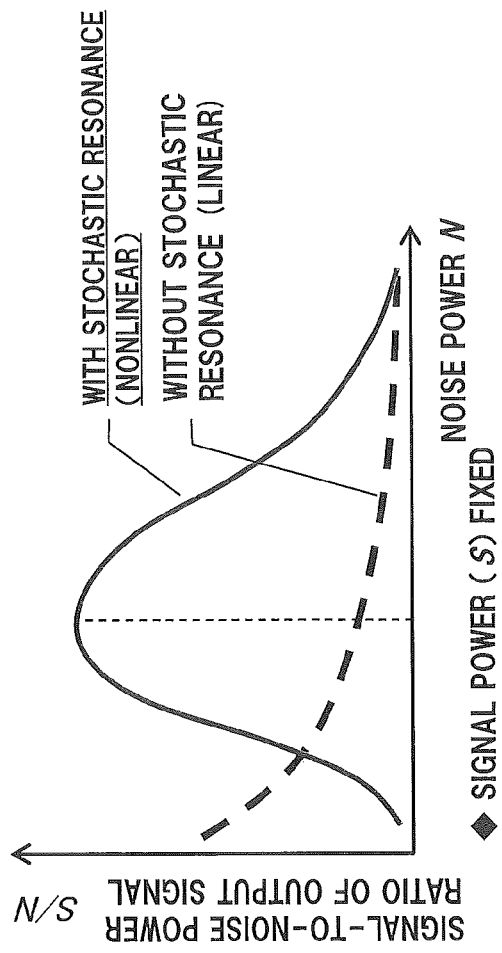

FIG. 14 is a graph with an illustration which are used for explaining stochastic resonance. In the case where the threshold ξ of each nonlinear element is set to a value greater than the voltage level of the weak signal S, even when the weak signal is input to the nonlinear element, a H-level output cannot be obtained. When a signal containing a weak signal and noise superimposed thereon is input to the nonlinear element, the probability that the output of the nonlinear element becomes the H level increases with the level of the weak signal, and the higher the level of the weak signal, the greater the occupation area of the pulses output from the nonlinear element. The higher the noise level, the higher the probability that the input signal exceeds the threshold ξ and the higher the detection accuracy of the weak signal. However, when the noise level increases further, the amount of noise contained in the output of the nonlinear element increases, and the reproduction accuracy of the weak signal deteriorates. Accordingly, in the case where signal reproduction is performed through use of a single nonlinear element, there exists a noise level at which the S/N ratio of the reproduced signal is maximized. This phenomenon is called "stochastic resonance."

Figure 13:
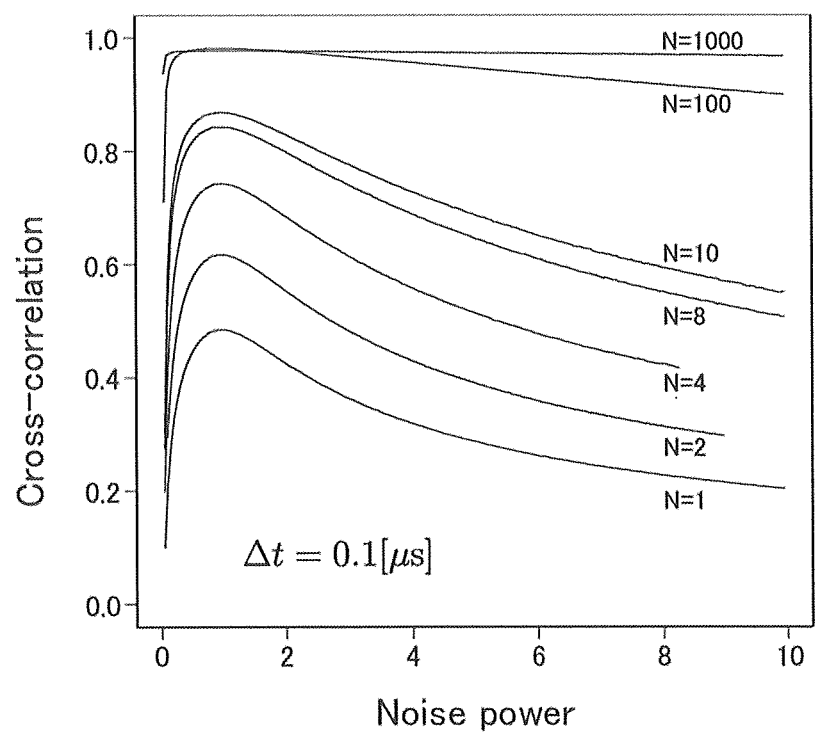
FIG. 13 is a characteristic graph showing the relation between the power level of noise superimposed on an input signal and the correlation between the reproduced weak signal and its original signal, with the number N of signals which are delayed and combined being used as a parameter.

In the present invention, instead of a single nonlinear element, N nonlinear elements $NL_1$-$NL_N$ are used, and delay signals $DS_1$-$DS_n$ obtained by delaying the nonlinear output signals $NLO_1$-$NLO_N$ by different times are combined. Through this combining operation, the noise component is cancelled due to decorrelation of the noise component. Since the noise component can be cancelled, the S/N ratio of the delayed combined signal DA can be increased irrespective of the threshold ξ of the nonlinear elements $NL_1$-$NL_N$ and noise level. FIG. 13 shows the relation between the value of correlation between the delayed combined signal DA and the weak signal S, and the number N of the delay signals $DS_1$-$DS_n$. The minimum delay time difference Δt is 0.1 μs, and the pulse width T of the weak signal S is 2 ms. In the case where N is equal to or greater than 10, the value of correlation between the delayed combined signal DA and the weak signal S becomes 0.6 or greater irrespective of noise level. In the case where N is equal to or greater than 100, a value of correlation near 1 is obtained.

In the present embodiment, since the maximum delay time difference is (N−1)Δt, weak signals within a period corresponding to the maximum delay time difference are delayed and combined. Accordingly, in the case where (N−1)Δt=T is satisfied, a pulse having a pulse width T and serving as a weak signal can be reproduced as a pulse whose pulse width is 2 T and whose half-value width is T. Also, in the case where (N−1)Δt=T/2 is satisfied, it can be reproduced as a pulse whose pulse width is T and whose half-value width is T/2. In the case where (N−1)Δt is sufficiently short as compared with T, it can be reproduced as a pulse whose pulse width is T.

This can be generalized as follows. The weak signal is assumed to be a signal having a generalized waveform, such as a periodic signal, an aperiodic signal, a single signal, or the like. In the spectrum of this weak signal, the maximum frequency is represented by f. If a sinusoidal wave of the maximum frequency f can be reproduced, the weak signal can be reproduced accurately. When the maximum delay time difference (N−1)Δt is set to 1/(2 f), the weak signal is delayed by Δt each time and is combined during a period corresponding to the half cycle of the sinusoidal wave of the maximum frequency. In this case, the sinusoidal wave of the maximum frequency f can be reproduced as a sinusoidal wave whose frequency is f (whose phase differs from the original waveform). In the case where the maximum delay time difference (N−1)Δt is set to 1/(4 f), the weak signal is delayed by Δt each time and is combined during a period corresponding to ¼ of the cycle of the sinusoidal wave of the maximum frequency (a period corresponding to a phase difference of π/2). In this case as well, the sinusoidal wave of the maximum frequency f can be reproduced as a sinusoidal wave whose frequency is f (whose phase differs from the original waveform). In the case where (N−1)Δt is sufficiently short as compared with 1/(2 f), the amplitude of the sinusoidal wave of the maximum frequency f can be reproduced without attenuation as compared with the amplitudes of the sinusoidal waves of other frequency components. Accordingly, when the maximum delay time difference (N−1)Δt is shortened, the weak signal can be reproduced without distortion.

After all, in the case where the weak signal S having a generalized waveform is reproduced, the reciprocal of the maximum delay time difference is proportional to the reproduction accuracy of the waveform. When the maximum delay time difference is set to a certain value W or a smaller value in order to obtain a predetermined waveform reproduction accuracy, a relation (N−1)Δt≤W must be satisfied. Accordingly, from the viewpoint of increasing the S/N ratio, it is desired that N be large and the minimum delay time difference Δt be longer than the correlation time of noise. However, from the viewpoint of waveform distortion, these are not desired. Therefore, as to N and Δt, their optimal values are present from the viewpoint of the S/N ratio and waveform distortion.

Second Embodiment

Figure 2A:
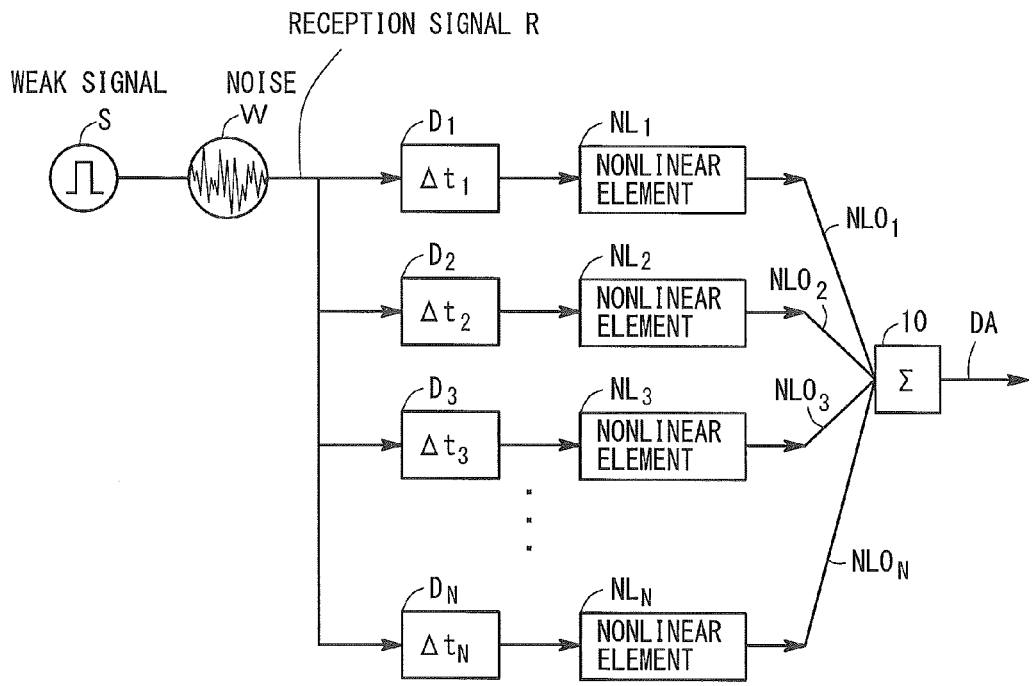
FIG. 2.A is a block diagram showing the configuration of a signal reproduction apparatus according to a second embodiment of the present invention.
Figure 2B:
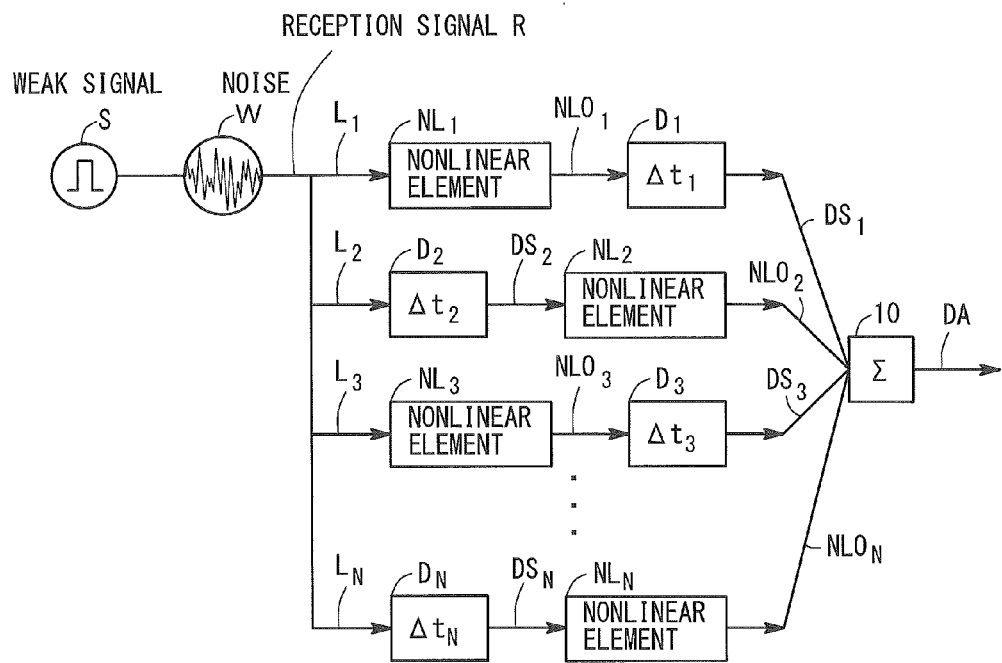

FIG. 2.A shows the configuration of a signal reproduction apparatus 2 according to a second embodiment. Elements identical with those of the first embodiment are denoted by the same symbols. In the present embodiment 2, the order of connection of the delay elements $D_1$-$D_N$ and the nonlinear elements $NL_1$-$NL_N$ in the first embodiment is reversed. Namely, the signals output from the delay elements $D_1$-$D_N$ are input to the nonlinear elements $NL_1$-$NL_N$, and the nonlinear output signals $NLO_1$-$NLO_N$ output from the nonlinear element $NL_1$-$NL_N$ are input to the combiner 10. In the present embodiment, the reception signal R shown in FIG. 5(b) is delayed by delay times, respectively, which are determined by an arithmetic progression Δt, . . . kΔt, . . . NΔt (k=1, 2, . . . N). Even when the reception signal R shown in FIG. 5(b) is delayed, the signal waveform is maintained. Therefore, even in the case where the reception signal R is input to the nonlinear elements $NL_1$-$NL_N$ after being delayed, the outputs of the nonlinear elements $NL_1$-$NL_N$ become the same as the outputs shown in FIG. 7(d) in the first embodiment. Therefore, the effects of the present invention can be realized by such a configuration as well.

A configuration shown in FIG. 2.B may be employed as a modification of the second embodiment. As to the order of connection of the delay elements $D_1$-$D_N$ and the nonlinear elements $NL_1$-$NL_N$, there may exist, in a mixed manner, the case where the nonlinear element is located before the delay element, and the case where the delay element is located before the nonlinear element. Branch lines ($L_1$, $L_3$, . . . ) in which a nonlinear element ($NL_1$, $NL_3$, . . . ) and a delay element ($D_1$, $D_3$, . . . ) are connected in this order from the side where the reception signal R is input are first lines. Branch lines ($L_2$, . . . $L_N$) in which a delay element ($D_2$, . . . $D_N$) and a nonlinear element ($NL_2$, . . . $NL_N$) are connected in this order from the side where the reception signal R is input are second lines. The number of the first lines and the number of the second lines are arbitrary, and may be the same or different. Also, only the first lines may be provided together on the upper side of the drawing and only the second lines are provided together on the lower side of the drawing.

Alternatively, the first lines and the second lines may be disposed alternatingly.

Third Example

Figure 3A:
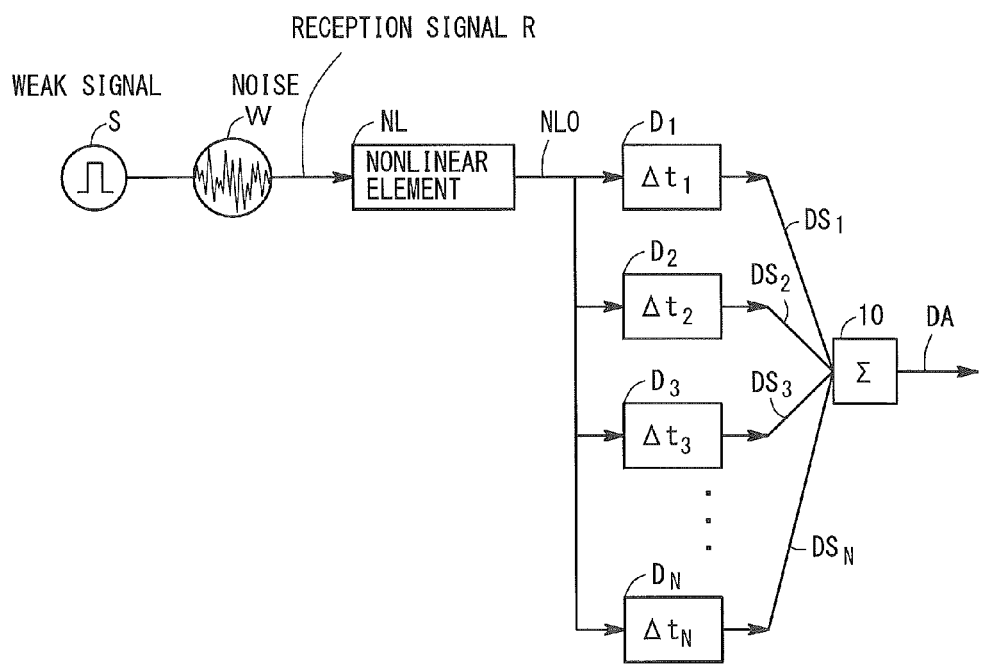
FIG. 3.A is a block diagram showing the configuration of a signal reproduction apparatus according to a third embodiment of the present invention.
Figure 3B:
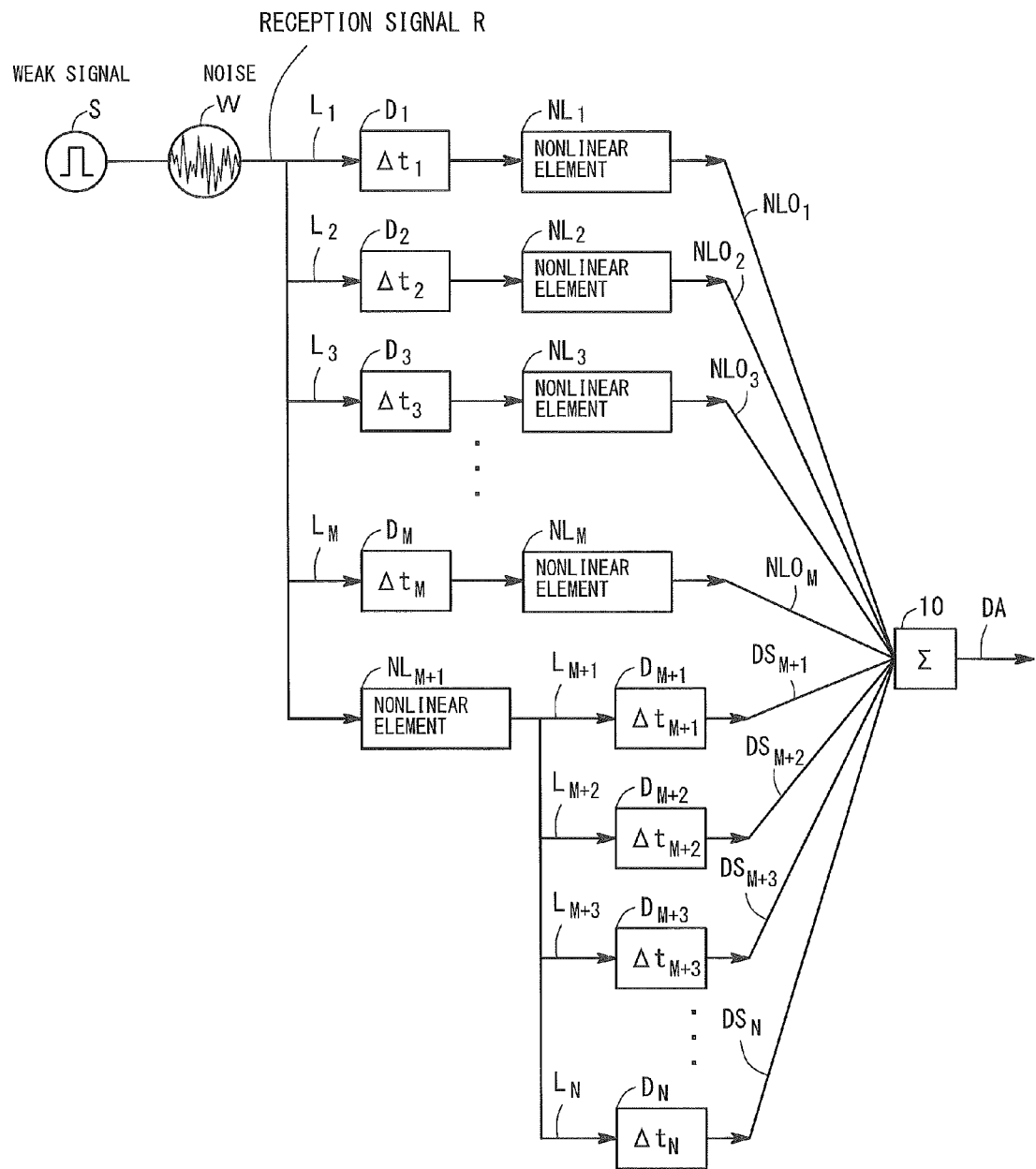

In the first embodiment, the reception signal R is split into N signals, and N nonlinear elements $NL_1$-$NL_N$ are used. In FIG. 1, the same reception signal R is input to the nonlinear elements $NL_1$-$NL_N$. Therefore, in the case where the nonlinear elements $NL_1$-$NL_N$ have the same nonlinear characteristics, the output signals of the nonlinear elements $NL_1$-$NL_N$ become the same. Therefore, the nonlinear elements $NL_1$-$NL_N$ can be replaced with a single nonlinear element. FIG. 3.A shows a configuration in which a single nonlinear element NL is used. The nonlinear output signal NLO output from the nonlinear element NL is the same as that shown in FIG. 7(b). When the nonlinear output signal NLO is split into N signals and these signals are input to delay elements $D_1$-$D_N$, the delay signals $DS_1$-$DS_n$ output from the delay elements $D_1$-$D_N$ become the same as those shown in FIG. 7(d). Accordingly, the present embodiment provides the same effects as those of the first embodiment.

Also, the third embodiment may be modified by applying the configuration of the third embodiment (in which a single common nonlinear element is used) to the fist lines of the modification of the second embodiment in which the nonlinear elements are located before the delay elements.

Namely, as shown in FIG. 3.B, there is provided a second line composed of M branch lines ($L_1, \ldots L_M$) (M is a natural number smaller than N) in which a delay element ($D_1, \ldots D_M$) and a nonlinear element ($NL_1, \ldots NL_M$) are connected in series in this order from the side where the reception signal R is input. The first line includes a single common nonlinear element $NL_{M+1}$ and delay elements ($D_{M+1}, \ldots D_N$) disposed in branch lines ($L_{M+1}, \ldots L_N$) which split the output signal of the nonlinear element $NK_{M+1}$ into (N−M) signals.

As described above, in the first line provided in the front stage, nonlinear elements can be replaced with a single common nonlinear element.

Fourth Embodiment

Figure 4:
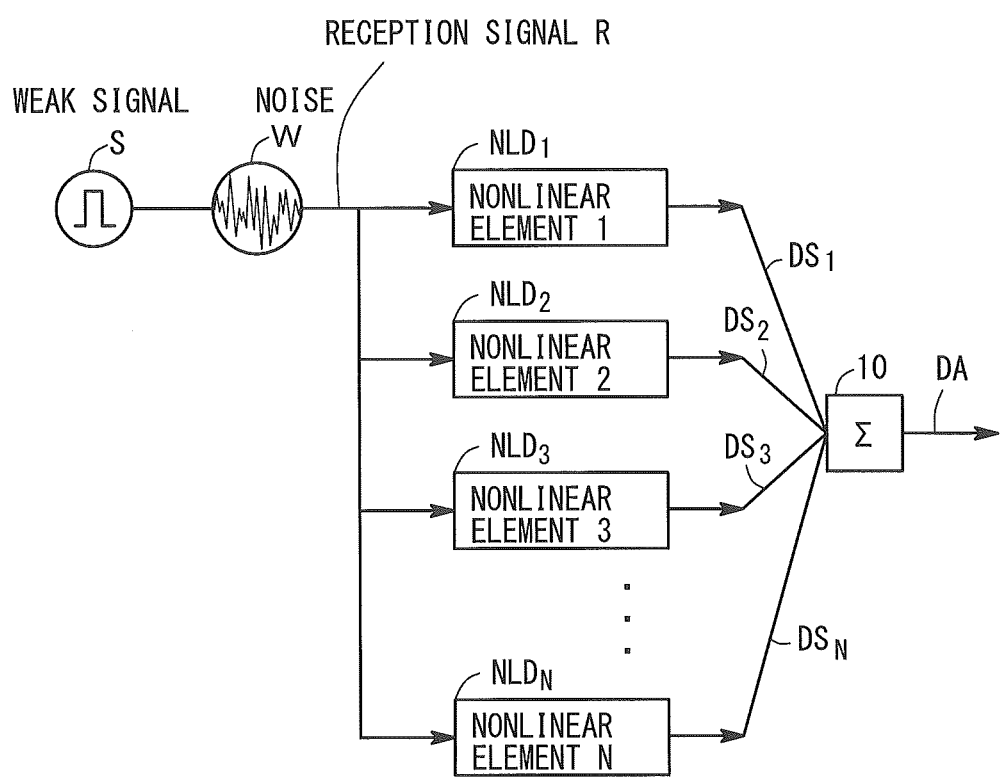
FIG. 4 is a block diagram showing the configuration of a signal reproduction apparatus according to a fourth embodiment of the present invention.

In the present fourth embodiment, the delay elements $D_1$-$D_N$ and the nonlinear elements $NL_1$-$NL_N$ in the first and second embodiments are integrated. FIG. 4 shows the configuration of the fourth embodiment. Nonlinear elements $NLD_1$-$NLD_N$ have different response speeds. Therefore, both the delaying operation and the nonlinear operation can be realized by the function of the nonlinear element.

Fifth Embodiment

Figure 10:
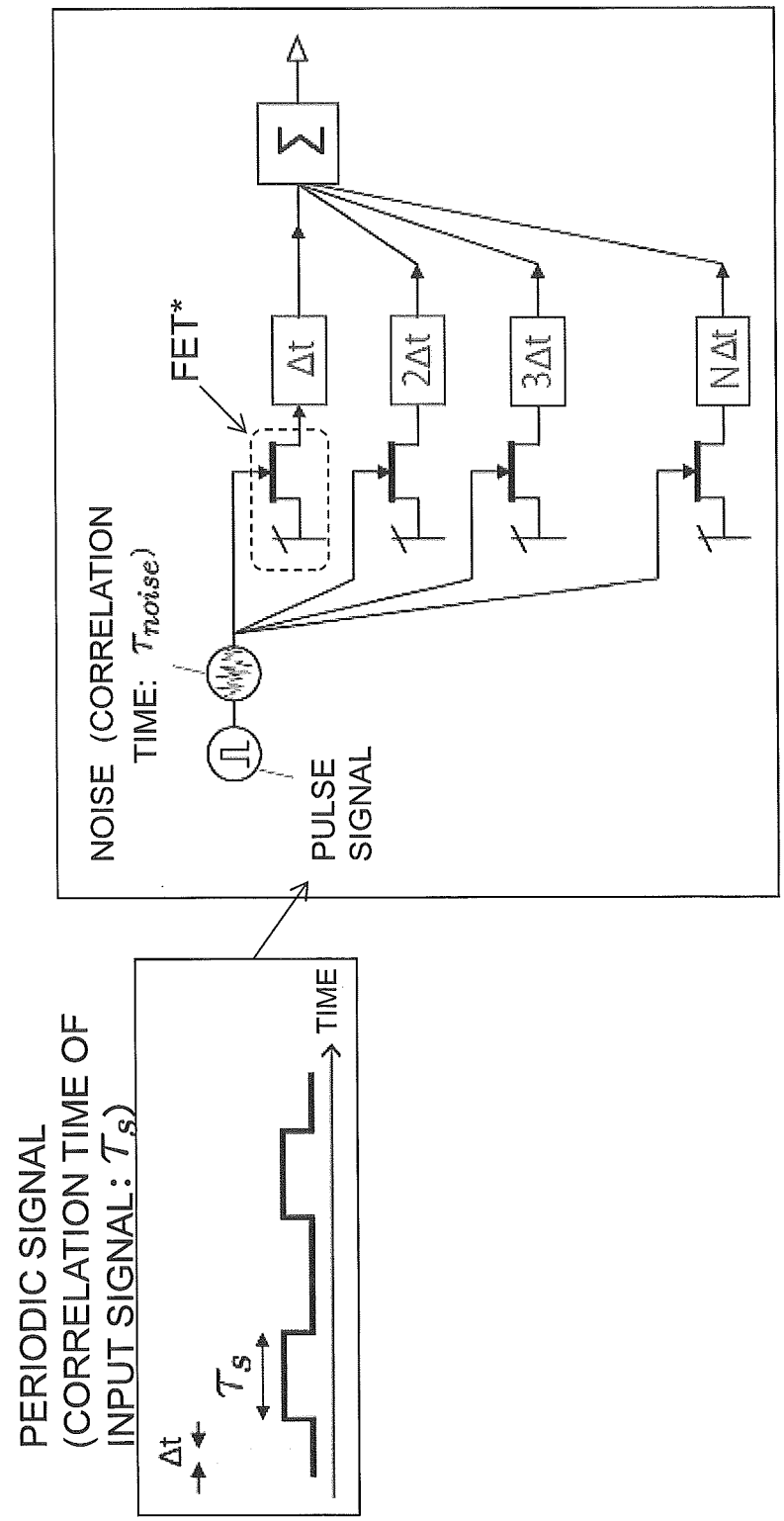
FIG. 10 is a block diagram showing the configuration of a signal reproduction apparatus according to a fifth embodiment of the present invention.
Figure 11:
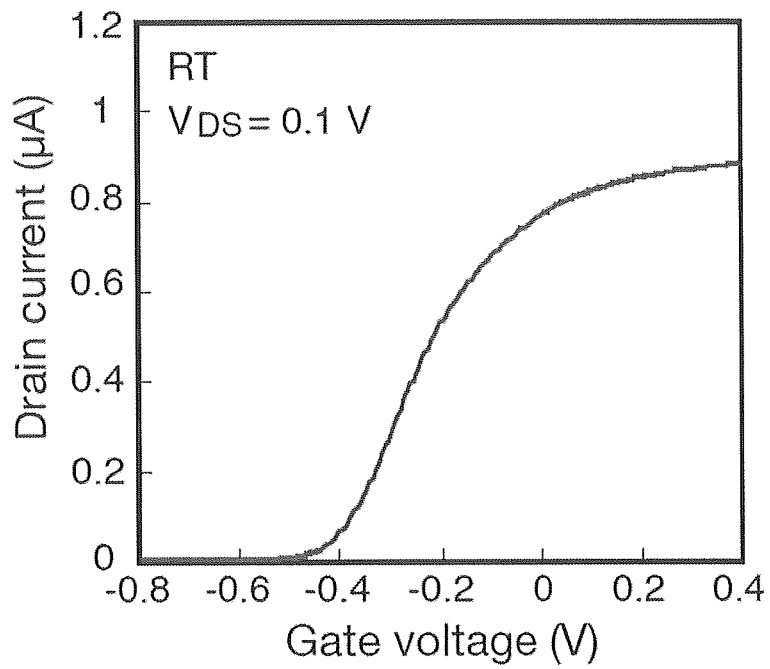
FIG. 11 is a characteristic graph showing the nonlinear characteristic of a field effect transistor used in the signal reproduction apparatus of the fifth embodiment of the present invention.

In the first through fourth embodiments, comparators are used as the nonlinear elements $NL_1$-$NL_N$. However, as shown in FIG. 10, field effect transistors FETs may be used. The nonlinear operation characteristic of each field effect transistor as shown in FIG. 11 can be used. The threshold is set to the gate threshold voltage of the field effect transistor.

In all the above-described embodiments, the reception signal R may be a single signal, a periodic continuous signal, an aperiodic continuous signal, or a discrete signal. In the case of a continuous periodic signal, the above-described pulse width T is the half cycle thereof. Since a transmitter imposes a band restriction on a weak signal to be transmitted, the reception signal has a maximum frequency f. By setting the maximum delay time difference to 1/(2 f); i.e., to the half cycle of the sinusoidal wave of the maximum frequency, the correlation of the weak signal can be increased. Desirably, the maximum delay time difference is set to 1/(4 f); i.e., to ¼ of the cycle of the sinusoidal wave of the maximum frequency (a period corresponding to a phase difference of π/2), whereby the correlation of the weak signal can be increased further.

Sixth Embodiment

In the present embodiment, the delaying and combining operation of the third embodiment shown in FIG. 3.A is realized by a different means. As having been described in the third embodiment, in the configuration of FIG. 3.A, the reception signal R is input to a nonlinear element NL, and a nonlinear output signal NLO is obtained from that element. The nonlinear output signal NLO is delayed by different delay times $\Delta t_1$-$\Delta t_N$, and the resultant delay signals are combined. As a result, a delayed combined signal DA is obtained.

Figure 15:
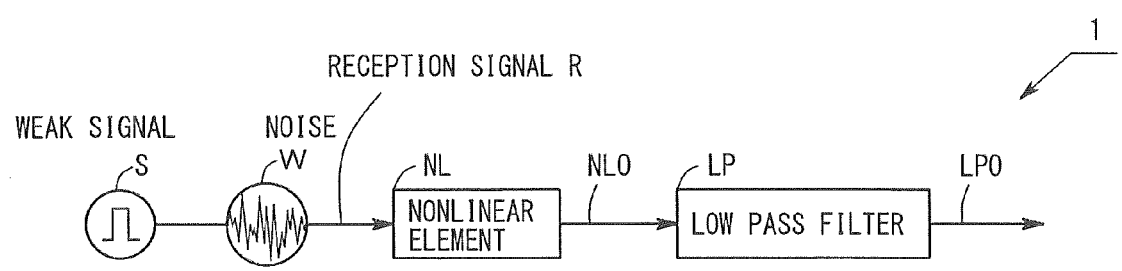
FIG. 15 is a block diagram showing the configuration of a signal reproduction apparatus according to a sixth embodiment of the present invention.

A signal reproduction apparatus of the present sixth embodiment will be described. FIG. 15 shows the configuration of a signal reproduction apparatus 1 of the present embodiment. As described above, an input signal is a signal containing a weak signal S (information to be transmitted) and noise W superimposed thereon, and, in the present embodiment, the input signal is a reception signal R. The reception signal R is input to a nonlinear element NL (comparator), and a nonlinear output signal NLO is output from the element. This nonlinear output signal NLO is input to a low pass filter LP, whereby frequencies higher than a cutoff frequency $f_c$ are cut off. In the present embodiment, the low pass filter LP is an analog filter composed of a resistor and a capacitor.

Figure 16:
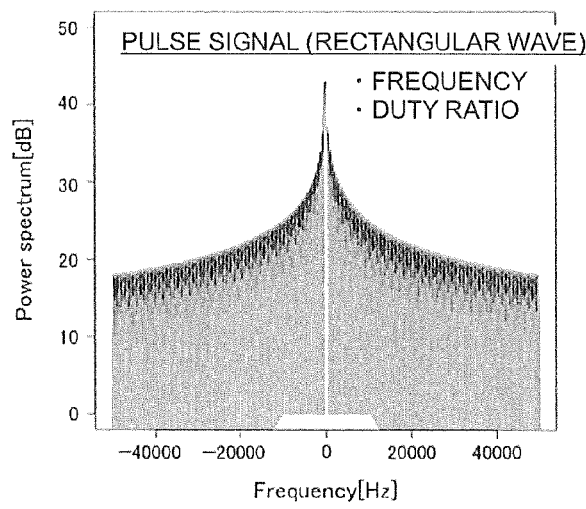
FIG. 16 is a graph showing the frequency characteristic of a weak signal to be reproduced which is obtained through Fourier transformation.
Figure 17:
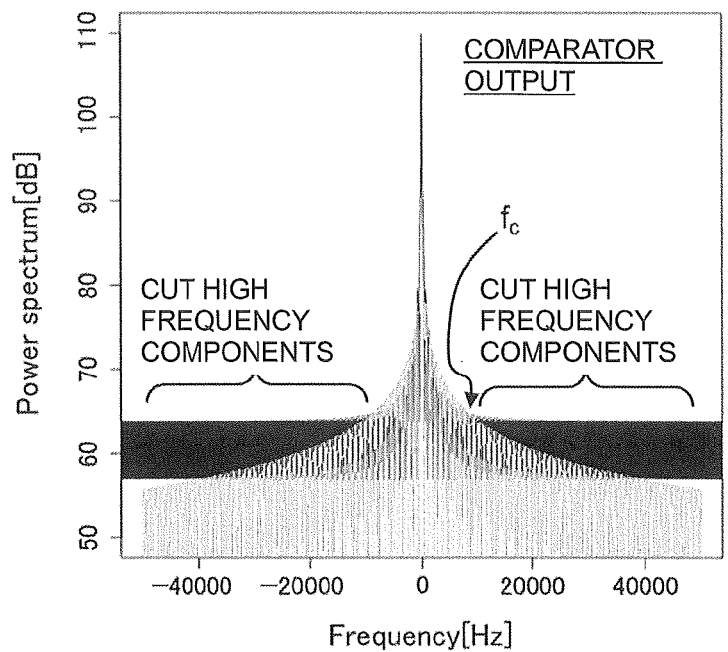
FIG. 17 is a graph showing the frequency characteristic of a nonlinear output signal output from a comparator which is a nonlinear element, which characteristic is obtained through Fourier transformation.

FIG. 16 shows the frequency characteristic of the weak signal S, obtained through Fourier transformation, for the case where the weak signal S is a rectangular wave whose duty ratio is 20% (pulse width: 2 ms) and whose repetition frequency is 100 Hz. FIG. 17 shows the frequency characteristic of the nonlinear output signal NLO output from the nonlinear element NL (comparator), obtained through Fourier transformation. In FIG. 17, the frequency characteristic of the nonlinear output signal of the weak signal S and the frequency characteristic of the nonlinear output signal of the noise W are shown separately. In the Fourier transformation of the nonlinear output signal NLO of FIG. 17, the upper limit of a frequency range in which the level becomes higher that the noise level is represented by $f_c$. The cutoff frequency of the low pass filter LP is set to $f_c$. Thus, the low pass filter LP removes, from the nonlinear output signal NLO, frequency components in a band higher than the frequency $f_c$. As a result, a reproduction signal LPO output from the low pass filter LP includes only frequency components whose frequencies are equal to or lower than the cutoff frequency $f_c$. Since the level of the weak signal S is sufficiently larger than the level of the noise W in a band below the cutoff frequency $f_c$, the weak signal S can be reproduced accurately.

Seventh Embodiment

Figure 18:
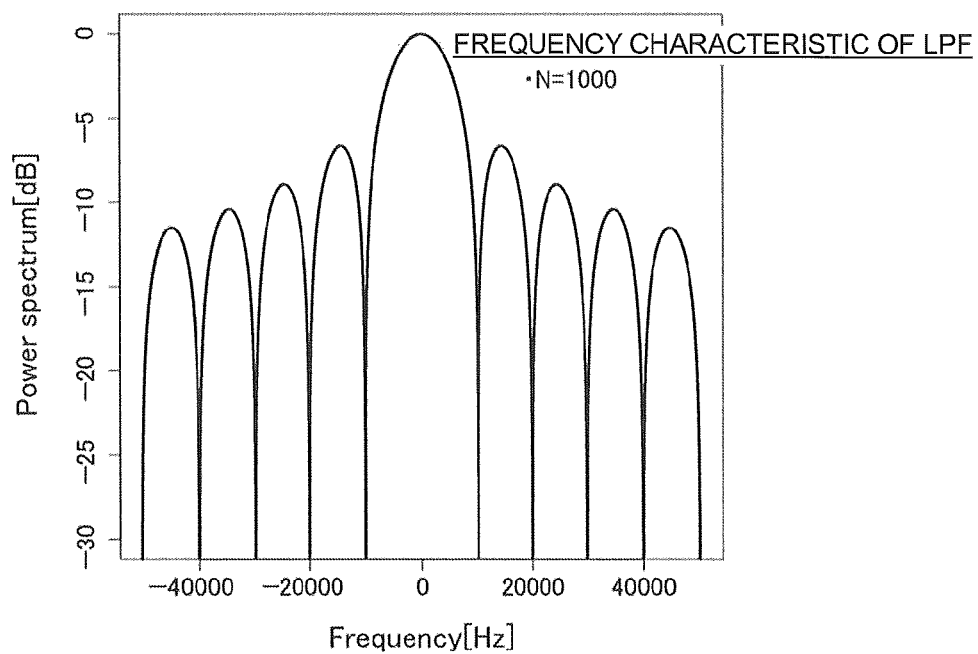
FIG. 18 is a characteristic graph showing the transfer function of a low pass filter of a signal reproduction apparatus according to a seventh embodiment.

In the present embodiment, the low pass filter LP is a digital filter, and the input signal input to the nonlinear element NL is a data signal obtained by sampling the reception signal R at a time interval $\Delta t$, and converting the amplitude to a digital value. FIG. 18 shows the frequency characteristic (transfer function) of the low pass filter LP. This characteristic is the Fourier transformation of a rectangular wave window function whose width on the time axis is $(N-1)\Delta t = T$. Namely, the output of the low pass filter LP having the frequency characteristic of FIG. 18 is the convolution of the rectangular wave window function and the nonlinear output signal NLO input to the low pass filter LP. Accordingly, the function of this low pass filter LP is equivalent to the operation of delaying and combing the nonlinear output signal NLO at the time interval $\Delta t$ in the period $(N-1)\Delta t = T$ in FIG. 3.A.

The Fourier transformation $G(\omega)$ of a rectangular function g(t) which provides 1 in the period T and 0 in other periods is a sigmoid function of $\omega$, and is represented by the following Expression.

$$G(\omega) = 2T \cdot \frac{\sin\left(\frac{\omega t}{2}\right)}{\frac{\omega t}{2}}$$ [Expression 1]

Figure 19:
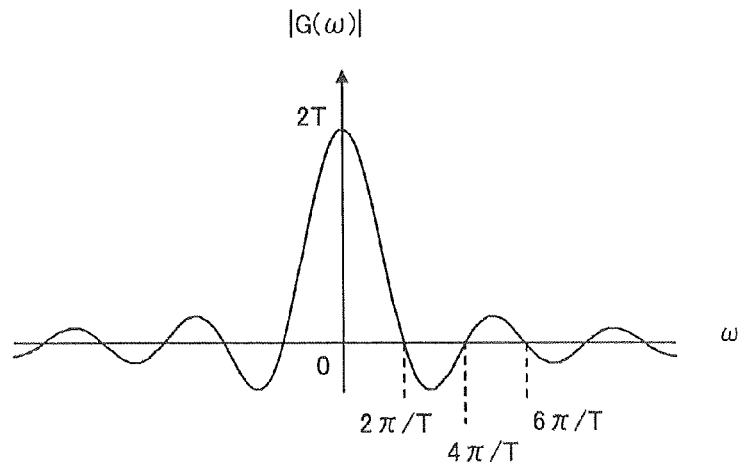
FIG. 19 is a characteristic graph showing the transfer function of the low pass filter of the signal reproduction apparatus according to the seventh embodiment.

FIG. 19 shows the frequency characteristic of $G(\omega)$. FIG. 18 shows this frequency characteristic wherein the vertical axis is logarithm and the horizontal axis represents frequency f. As described above, through use of a low pass filter whose transfer function becomes a sigmoid function as shown in FIGS. 18 and 19, accurate reproduction of the weak signal S becomes possible. FIG. 18 shows the frequency characteristic of a filter corresponding to a rectangular wave window function g(t) ($\Delta t=0.1$ μs, N−1=1000, the period T=(N−1)$\Delta t$=0.1 ms).

Eighth Embodiment

Figure 20:
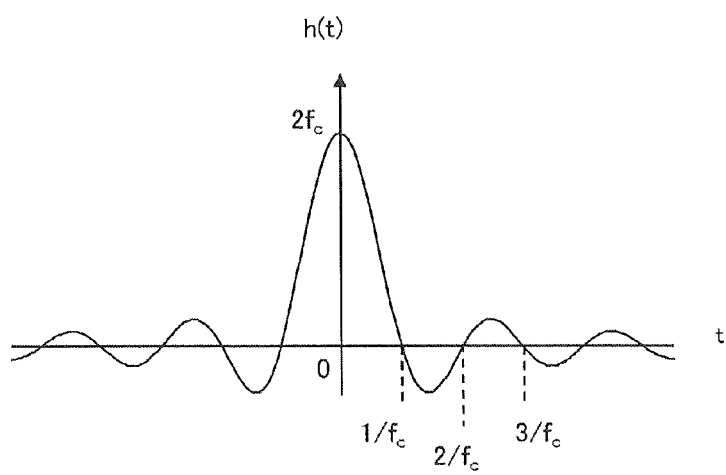
FIG. 20 is a characteristic graph showing the impulse response of a low pass filter of a signal reproduction apparatus according to an eighth embodiment.

Next, there will be described an example in which a digital filter whose transfer function differs from that of the seventh embodiment is used. The transfer function $H(\omega)$ of a low pass filter whose cut-off frequency is $f_c$ is assumed to provide 1 at frequencies equal to or lower than $f_c$ and 0 in other frequency bands. The inverse Fourier transformation h(t) of the transfer function $H(\omega)$ is a sigmoid function of time t and is represented by the following Expression.

$$h(t) = 2f_c \cdot \frac{\sin(\pi f_c t)}{\pi f_c t}$$ [Expression 2]

h(t) is the impulse response of a low pass filter having the transfer function $H(\omega)$, and has a time characteristic as shown in FIG. 20.

Figure 21:
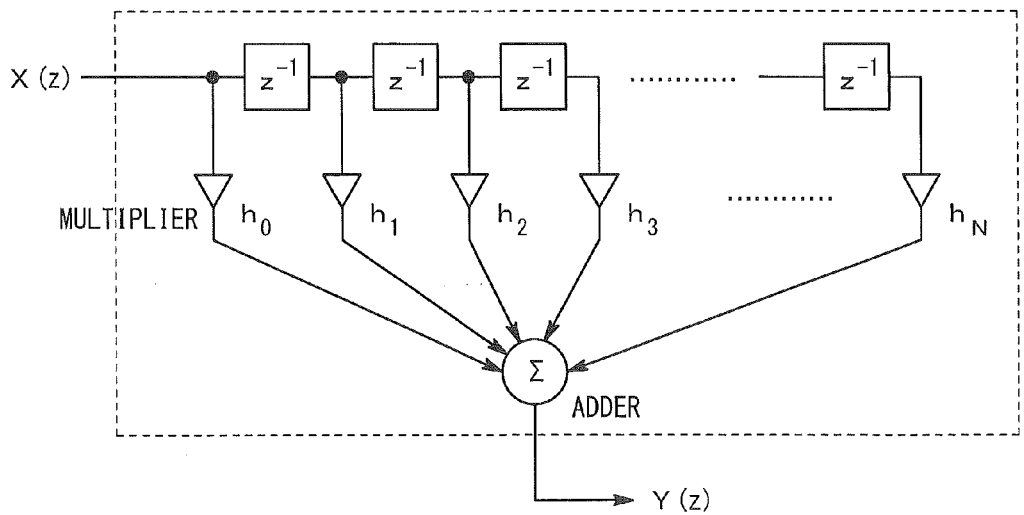
FIG. 21 is a block diagram showing the transfer function of the low pass filter of the signal reproduction apparatus according to the eighth embodiment.

In view of the above, $h(k\Delta t)$ (k is an integer, $\Delta t$ is sampling period of the reception signal R) is used to determine tap coefficients $h_0, \ldots, h_k, \ldots h_N$. FIG. 21 shows the transfer function $H(\omega)$ of the low pass filter. This is a block diagram of the transfer function of the digital low pass filter. A relation $z=\exp(j\omega\Delta t)$ is present between z and $\omega$. Accordingly, in the time domain, the transversal filter operates as follows. A reception signal T is delayed by 0, $\Delta t$, ... $k\Delta t$, ..., $N\Delta t$ successively, the produced delay signals are multiplied by the tap coefficients $h_0, h_k, \ldots h_N$, and the resultant signals are output from the respective taps of the transversal filter. A signal obtained by combining these signals becomes the output signal of the digital filter. In the present embodiment, since the the signal which is not delayed is also amplified at an amplification factor corresponding to the tap coefficient $h_0$ and is added, $N\Delta t=T$.

In the above-described embodiment, a comparator is used as the nonlinear element NL; however, a field effect transistor FET may be used. The nonlinear operation characteristic of the field effect transistor can be used. The threshold is set to the gate threshold voltage of the field effect transistor.

In all the above-described sixth through eighth embodiments, the reception signal R may be a single signal, a periodic continuous signal, an aperiodic continuous signal, or a discrete signal. In the case of a continuous periodic signal, the above-described pulse width T is the half cycle thereof. Since a transmitter imposes a band restriction on a weak signal to be transmitted, the reception signal has a maximum frequency f. By setting the cut-off frequency $f_c$ of the low pass filter to the double of the maximum frequency, the correlation of the weak signal can be increased. Desirably, the cut-off frequency $f_c$ of the low pass filter is set to the fourfold of the maximum frequency, whereby the correlation of the weak signal can be increased further.

INDUSTRIAL APPLICABILITY

The present invention can be used for receiving apparatuses which reproduce weak signals buried in noise.

Description of Symbols

S ... weak signal
W ... noise
R ... reception signal
$NL_1$-$NL_N$ ... nonlinear element
$D_1$-$D_N$ ... delay element
10 ... combiner
$NLO_1$-$NLO_N$ ... nonlinear output signal
$DS_1$-$DS_n$ ... delay signal
DA ... delayed combined signal
$L_1$-$L_N$ ... branch line
NL ... nonlinear element
LP ... low pass filter

The invention claimed is:

1. A signal reproduction apparatus which reproduces, from an input signal containing a weak signal which includes a piece of transmission information and noise superimposed thereon, the weak signal through use of a stochastic resonance phenomenon, the apparatus comprising:
a nonlinear element; and
an interpolation device which performs an interpolation in a time domain of an output signal of the nonlinear element for the input signal, the output signal changing with time serving as a variable,
wherein an interval of the interpolation is equal to or less than a reciprocal 1/(2 f) of a double of a maximum frequency f of the weak signal to be reproduced.

2. A signal reproduction apparatus according to claim 1, wherein the interpolation device includes:
N branch lines (N is a natural number equal to or greater than 2);
N delay elements which delay N split signals supplied to the branch lines by different times, respectively; and
a combiner which combines into a single signal the signals which have passed at least corresponding delay elements in the N branch lines.

3. A signal reproduction apparatus according to claim 2, wherein the input signal is split into split signals to be supplied to the N branch lines, the nonlinear element is provided in each of the N branch lines, the split signals split from the input signal are input to the nonlinear elements, output signals of the nonlinear elements are input to the delay elements, and the combiner combines output signals of the delay elements.

4. A signal reproduction apparatus according to claim 2, wherein the input signal is split into split signals to be supplied to the N branch lines, the split signals split from the input signal are input to the delay elements, the nonlinear element is provided in each of the N branch lines, output signals of the delay elements are input to the corresponding nonlinear elements, and the combiner combines output signals of the nonlinear elements.

5. A signal reproduction apparatus according to claim 2, wherein the input signal is input to the nonlinear element, an output signal of the nonlinear element is split into N split signals to be supplied to the N branch lines, the split signals are input to the corresponding delay elements, and the combiner combines output signals of the delay elements.

6. A signal reproduction apparatus according to claim 2, wherein a first line in which the nonlinear element and the delay element are connected in this order from a side where the input signal is input and a second line in which the delay element and the nonlinear element are connected in this order from the side where the input signal is input are present in a mixed manner, and wherein the combiner combines the output signals of elements which are the nonlinear elements or the delay elements and which are located on a rear stage.

7. A signal reproduction apparatus according to claim 6, wherein the nonlinear element is provided in the first line is single, and an output signal of the nonlinear element is split into a plurality of split signals which are input to the delay elements in the first line.

8. A signal reproduction apparatus according to claim 2, wherein the nonlinear elements produce different delays in output due to non-uniformity of their characteristics, and serve as the corresponding delay elements.

9. A signal reproduction apparatus according to claim 2, wherein the delay times of the delay elements are determined by an arithmetic progression with a common difference $\Delta t$.

10. A signal reproduction apparatus according to claim 2, wherein a minimum delay time difference which is a smallest one of differences among the delay times of the N delay elements is greater than a correlation time of the noise superimposed on the weak signal.

11. A signal reproduction apparatus according to claim 2, wherein a maximum delay time difference which is a largest one of differences among the delay times of the N delay elements is equal to or less than $1/(2f)$.

12. A signal reproduction apparatus according to claim 2, wherein a maximum delay time difference which is a largest one of differences among the delay times of the N delay elements is equal to or less than T, where T is a time width which is a reproduction unit of the weak signal.

13. A signal reproduction apparatus which reproduces, from an input signal containing a weak signal which includes a piece of transmission information and noise superimposed thereon, the weak signal through use of a stochastic resonance phenomenon, the apparatus comprising:

a nonlinear element; and an interpolation device which performs an interpolation in a time domain of an output signal of the nonlinear element for the input signal, the output signal changing with time serving as a variable, wherein the input signal is input to the nonlinear element, and the interpolation device includes a low pass filter to which an output signal of the nonlinear element is input.

14. A signal reproduction apparatus according to claim 13, wherein a cutoff frequency of the low pass filter is set to a frequency equal to or higher than an upper limit of a frequency range within which a level of Fourier transformation of the output signal of the nonlinear element is higher than a level of the noise.

15. A signal reproduction apparatus according to claim 13, wherein a cutoff frequency of the low pass filter is smaller than a reciprocal of a correlation time of the noise superimposed on the weak signal.

16. A signal reproduction apparatus according to claim 13, wherein a cutoff frequency of the low pass filter is set to a frequency equal to or higher than 2 f, where f is a maximum frequency of the weak signal to be reproduced.

17. A signal reproduction apparatus according to claim 13, wherein the low pass filter includes a digital filter, and a sampling period of the input signal is longer than a correlation time of the noise.

18. A signal reproduction apparatus according to claim 2, wherein the nonlinear elements produce different delays in output due to a non-uniformity of characteristics of the nonlinear elements.

* * * * *